(12) United States Patent
Yamae et al.

(10) Patent No.: US 9,577,206 B2
(45) Date of Patent: *Feb. 21, 2017

(54) ORGANIC ELECTROLUMINESCENCE ELEMENT AND LIGHTING DEVICE USING SAME

(71) Applicant: PANASONIC CORPORATION, Osaka (JP)

(72) Inventors: Kazuyuki Yamae, Nara (JP); Nobuhiro Ide, Osaka (JP); Hitomichi Takano, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/772,548

(22) PCT Filed: Mar. 3, 2014

(86) PCT No.: PCT/JP2014/001149
§ 371 (c)(1),
(2) Date: Sep. 3, 2015

(87) PCT Pub. No.: WO2014/141623
PCT Pub. Date: Sep. 18, 2014

(65) Prior Publication Data
US 2016/0035991 A1  Feb. 4, 2016

(30) Foreign Application Priority Data
Mar. 13, 2013 (JP) ................ 2013-050585

(51) Int. Cl.
*H01L 51/52* (2006.01)
*H01L 51/50* (2006.01)
*H01L 51/00* (2006.01)

(52) U.S. Cl.
CPC ........ *H01L 51/504* (2013.01); *H01L 51/5004* (2013.01); *H01L 51/506* (2013.01);
(Continued)

(58) Field of Classification Search
USPC .......................................................... 428/917
See application file for complete search history.

(56) References Cited

U.S. PATENT DOCUMENTS 7,548,021 B2   6/2009  Cok et al.
8,049,233 B2   11/2011 Fukshima et al.
(Continued)

FOREIGN PATENT DOCUMENTS

JP   2004-165154   6/2004
JP   2005-166637   6/2006
(Continued)

OTHER PUBLICATIONS

Decision to Grant a Patent for JP2015-505265, dated Sep. 29, 2015, along with English-language translation.

*Primary Examiner* — Ashok Patel
(74) *Attorney, Agent, or Firm* — Greenblum & Bernstein, P.L.C.

(57) ABSTRACT

The present disclosure relates to an organic electroluminescence element including: a substrate having a light transmissive property; a light diffusion layer; a light transmissive electrode; a light reflective electrode; and multiple light emitting layers spaced from each other. With regard to the m-th light emitting layer being the m-th closest light emitting layer to the light reflective electrode, relations defined by following expressions (2) and (3) are satisfied. In the following expressions, $\lambda_m$ represents the weighted average emission wavelength, $\emptyset(\lambda_m)$ represents the phase shift, $n_m(\lambda_m)$ represents the average refractive index of a medium
(Continued)

filling a space between the light reflective electrode and the m-th light emitting layer, and $d_m$ represents the distance from the light reflective electrode to the m-th light emitting layer. l is an integer equal to or more than 0.

[FORMULA 1]

$$\phi(\lambda_m) \times \frac{\lambda_m}{4\pi} + \frac{l+0.1}{2}\lambda_m \le n_m(\lambda_m) \times d_m \le \phi(\lambda_m) \times \frac{\lambda_m}{4\pi} + \frac{l+0.6}{2}\lambda_m \quad (2)$$

$$n_m(\lambda_m) \times d_m \ge 0.6\lambda_m \quad (3)$$

9 Claims, 19 Drawing Sheets

(52) U.S. Cl.
CPC ...... H01L 51/5044 (2013.01); H01L 51/5206 (2013.01); H01L 51/5221 (2013.01); H01L 51/5262 (2013.01); H01L 51/5268 (2013.01); H01L 51/5271 (2013.01); H01L 51/5278 (2013.01); H01L 51/5281 (2013.01); *H01L 51/0095* (2013.01)

(56) References Cited

U.S. PATENT DOCUMENTS

| | | |
|---|---|---|
| 8,525,204 B2 | 9/2013 | Fukshima et al. |
| 8,710,735 B2 | 4/2014 | Shirai et al. |
| 8,716,736 B2 | 5/2014 | Yamae et al. |
| 8,890,136 B2 | 11/2014 | Yamae |
| 9,112,181 B2 | 8/2015 | Yamae et al. |
| 2005/0098207 A1 | 5/2005 | Matsumoto et al. |
| 2006/0261333 A1 | 11/2006 | Murakami et al. |
| 2007/0035234 A1 | 2/2007 | Lee |
| 2011/0248253 A1 | 10/2011 | Yamana et al. |
| 2014/0191226 A1* | 7/2014 | Yamae ................. H01L 51/5036 257/40 |
| 2014/0225099 A1 | 8/2014 | Yamae et al. |
| 2015/0034929 A1 | 2/2015 | Ide et al. |
| 2015/0041783 A1 | 2/2015 | Ide et al. |
| 2015/0069349 A1 | 3/2015 | Hayashi et al. |
| 2015/0270512 A1* | 9/2015 | Yamae ................. H01L 51/5268 257/40 |

FOREIGN PATENT DOCUMENTS

| | | |
|---|---|---|
| JP | 2006-155940 | 6/2006 |
| JP | 2006-236748 | 9/2006 |
| JP | 2006-324536 | 11/2006 |
| JP | 2007-53091 | 3/2007 |
| JP | 2007-115645 | 5/2007 |
| JP | 2007-265638 | 10/2007 |
| JP | 2010-526420 | 7/2010 |
| JP | 2011-233289 | 11/2011 |
| JP | 2012-037912 | 2/2012 |
| WO | 2010-071195 | 6/2010 |
| WO | 2013/024787 | 2/2013 |

* cited by examiner

● :Complete random

☐ :Periodic structure

●
Complete random w=0.6μm

△
Controlled random w=1.2μm

□
Controlled random w=1.2μm

● Complete random w=0.6μm

△ Controlled random w=1.2μm

ORGANIC ELECTROLUMINESCENCE ELEMENT AND LIGHTING DEVICE USING SAME

TECHNICAL FIELD

The present invention relates to organic electroluminescence elements, and lighting devices using same, and in particular relates to an organic electroluminescence element including multiple light emitting layers, and a lighting device.

BACKGROUND ART

In a generally known structure of an organic electroluminescence element (hereinafter referred to as "organic EL element"), an anode made of a transparent electrode, a hole transport layer, a light emitting layer, an electron injection layer, and a cathode are stacked on a surface of a transparent substrate in this order. In this organic EL element, light is produced in an organic light emitting layer in response to application of voltage between the anode and the cathode, and the produced light passes through the transparent electrode and the transparent substrate and emerges outside.

Generally, the organic EL element has the light-outcoupling efficiency in the range of about 20% to 30%. Such low light-outcoupling efficiency means that 70% to 80% of the total amount of produced light does not effectively contribute to light emission. This is because, due to total reflection at interfaces between materials with different refractive indexes, light absorption by materials, and the like, light cannot be effectively propagated to an outside in which light emission is observed. Consequently, it is considered that improvement of the light-outcoupling efficiency causes a great increase in the efficiency of the organic EL element.

There is studied and developed actively to improve the light-outcoupling efficiency. Especially, there have been many efforts to increase the amount of light which is produced in the organic layer and reaches the substrate layer. Generally, the refractive index of the organic layer is equal to or more than about 1.7, and normally the refractive index of the glass layer serving as the substrate is about 1.5. Therefore, a loss caused by total reflection at the interface between the organic layer and the glass layer (thin film waveguide mode) probably reaches about 50% of the total amount of radiated light. In view of this, it is possible to greatly improve the light-outcoupling efficiency of the organic EL element by decreasing the loss caused by the total reflection between the organic layer and the substrate.

Use of interference is considered as one of means for improving the light-outcoupling efficiency. For example, patent literature 1 (JP 2004-165154 A) discloses adjusting optical thicknesses by use of the interference in view of differences of phases so as to maximize a component of light.

SUMMARY OF INVENTION

Technical Problem

However, in the organic EL element, it is difficult to say that the optical design disclosed in the aforementioned patent literature also can sufficiently improve the light-outcoupling efficiency. There is demand for structures capable of improving the light-outcoupling efficiency more than the above design.

Recently, further increasing of luminance and efficiency, and prolonging of life of organic EL elements have been considered as big problems, and thus organic EL elements with a structure including a stack of multiple light emitting layers have attracted attention. For example, in an organic EL element with a multiunit structure, multiple light emitting layers are connected in series with electric conductive layers referred to as interlayers in-between. Thereby, it is possible to achieve high luminance, high efficiency, and long life, while maintaining a merit of a thin light source which is one of characteristics of organic electroluminescence elements. By reducing the current density to obtain the same luminance, it is possible to achieve increasing of efficiency and prolonging of life. However, in the structure including multiple light emitting layers which offers merits of increasing luminance and prolonging life, such structures require multiple light emitting positions, and/or multiple light emission wavelengths. Hence, it becomes more difficult to set preferable thickness conditions by use of the method of patent literature 1.

In view of the above insufficiency, the present invention has aimed to propose an organic EL element and a lighting device which have the enhanced light-outcoupling efficiency and the reduced view angle dependence.

Solution to Problem

The organic electroluminescence element of one embodiment according to the present invention includes:
a substrate having a light transmissive property;
a light diffusion layer on a surface of the substrate;
a light transmissive electrode on a surface of the light diffusion layer;
a light reflective electrode paired with the light transmissive electrode; and
multiple light emitting layers which are spaced from each other and are between the light transmissive electrode and the light reflective electrode,
the multiple light emitting layers including an m-th light emitting layer which is the m-th closest light emitting layer to the light reflective electrode, where m is an integer equal to or more than 1;
$\lambda_m$ representing a weighted average emission wavelength of the m-th light emitting layer;
$\phi_m$ representing a phase shift of light produced by the m-th light emitting layer caused by the light reflective electrode defined by a following expression (1):

[FORMULA 1]

$$\phi(\lambda_m) = \tan^{-1}\left\{\frac{2(n_s k_r - n_r k_s)}{n_s^2 - n_r^2 + k_s^2 - k_r^2}\right\} \quad (1)$$

wherein $n_s$ and $k_s$ represent a refractive index and an extinction coefficient of a layer in contact with the light reflective electrode, respectively, and $n_r$ and $k_r$ represent a refractive index and an extinction coefficient of a reflective layer, respectively, and $n_s$, $n_r$, $k_s$, and $k_r$ are functions of $\lambda_m$;
an average refractive index of a medium filling a space between the light reflective electrode and the m-th light emitting layer being represented by $n_m(\lambda_m)$;
a distance from the light reflective electrode to the m-th light emitting layer being represented by $d_m$; and each of at least two of the multiple light emitting layers satisfying relations defined by following expressions (2) and (3):

[FORMULA 2]

$$\phi(\lambda_m) \times \frac{\lambda_m}{4\pi} + \frac{l-0.1}{2}\lambda_m \le n_m(\lambda_m) \times d_m \le \phi(\lambda_m) \times \frac{\lambda_m}{4\pi} + \frac{l+0.6}{2}\lambda_m \quad (2)$$

where l is an integer equal to or more than 0,

[FORMULA 3]

$$n_m(\lambda_m) \times d_m \ge 0.6\lambda_m \quad (3)$$

Preferably, the aforementioned organic electroluminescence element further includes a carrier transport layer which is between the light reflective electrode and a first light emitting layer and is of a charge transport medium doped with donor material.

Preferably, in the aforementioned organic electroluminescence element, the light reflective electrode serves as a cathode, the light transmissive electrode serves as an anode, and the organic electroluminescence element further includes a charge inversion layer and a hole transport layer which are arranged between the light reflective electrode and the first light emitting layer in this order from the first light emitting layer.

Preferably, in the aforementioned organic electroluminescence element, the light diffusion layer includes a first transparent material layer and a second transparent material layer arranged in this order from the substrate, and an uneven structure is provided to an interface between the first transparent material layer and the second transparent material layer.

Preferably, in the aforementioned organic electroluminescence element, the uneven structure is defined by an aggregate of protruded parts or recessed parts arranged in plane.

Preferably, in the aforementioned organic electroluminescence element, with regard to any part of the aggregate of protruded parts or recessed parts, an axial length of an inscribed ellipse or a diameter of an inscribed circle when viewed in a direction perpendicular to a surface of the substrate is in a range of 0.4 µm to 4 µm.

Preferably, in the aforementioned organic electroluminescence element, the aggregate of protruded parts or recessed parts has a plane divided into an array of sections, and the protruded parts or recessed parts are arranged by being individually allocated to sections randomly selected from the array.

Preferably, in the aforementioned organic electroluminescence element, the protruded parts are arranged so that the number of protruded parts arranged by being individually allocated to consecutive sections of the array in a same direction is not greater than a predetermined number, and the recessed parts are arranged so that the number of recessed parts arranged by being individually allocated to consecutive sections of the array in a same direction is not greater than a predetermined number.

Preferably, the aforementioned organic electroluminescence element further includes a light-outcoupling layer on an opposite surface of the substrate from the light diffusion layer.

The lighting device of one embodiment according to the present invention includes one of the aforementioned organic electroluminescence elements.

Advantageous Effects of Invention

Due to the present invention, an optical interference in view of plasmon loss is used and therefore an amount of light emerging outside can be increased efficiently. As a result, it is possible to obtain the organic EL element and the lighting device which have the enhanced light-outcoupling efficiency and the reduced view angle dependence, and thereby are excellent in the light emitting property.

DESCRIPTION OF EMBODIMENTS

Figure 1:
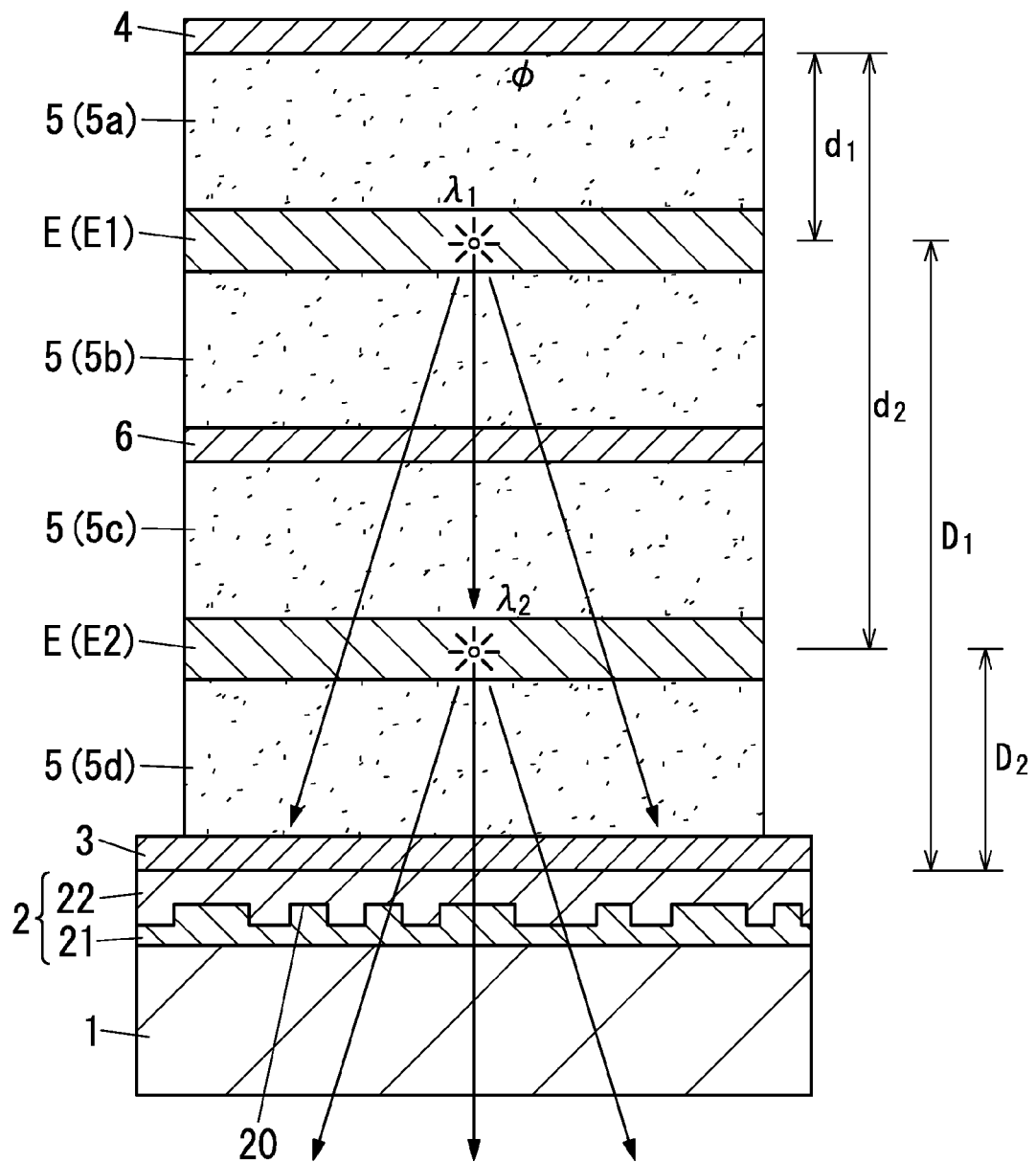
FIG. 1 is a schematic section illustrating an example of one embodiment of the organic electroluminescence element.
Figure 2:
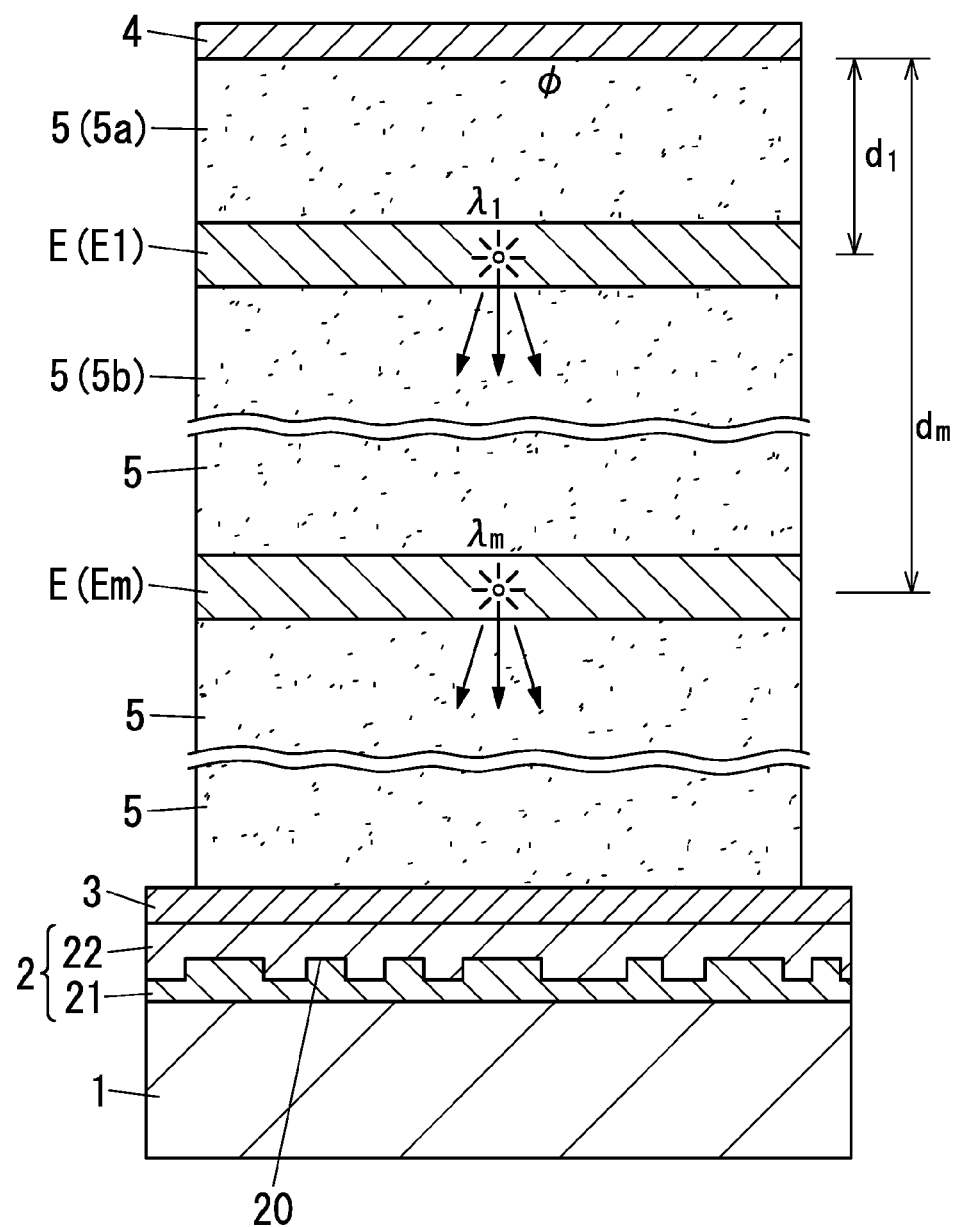
FIG. 2 is a schematic section illustrating another example of one embodiment of the organic electroluminescence element.
Figure 3:
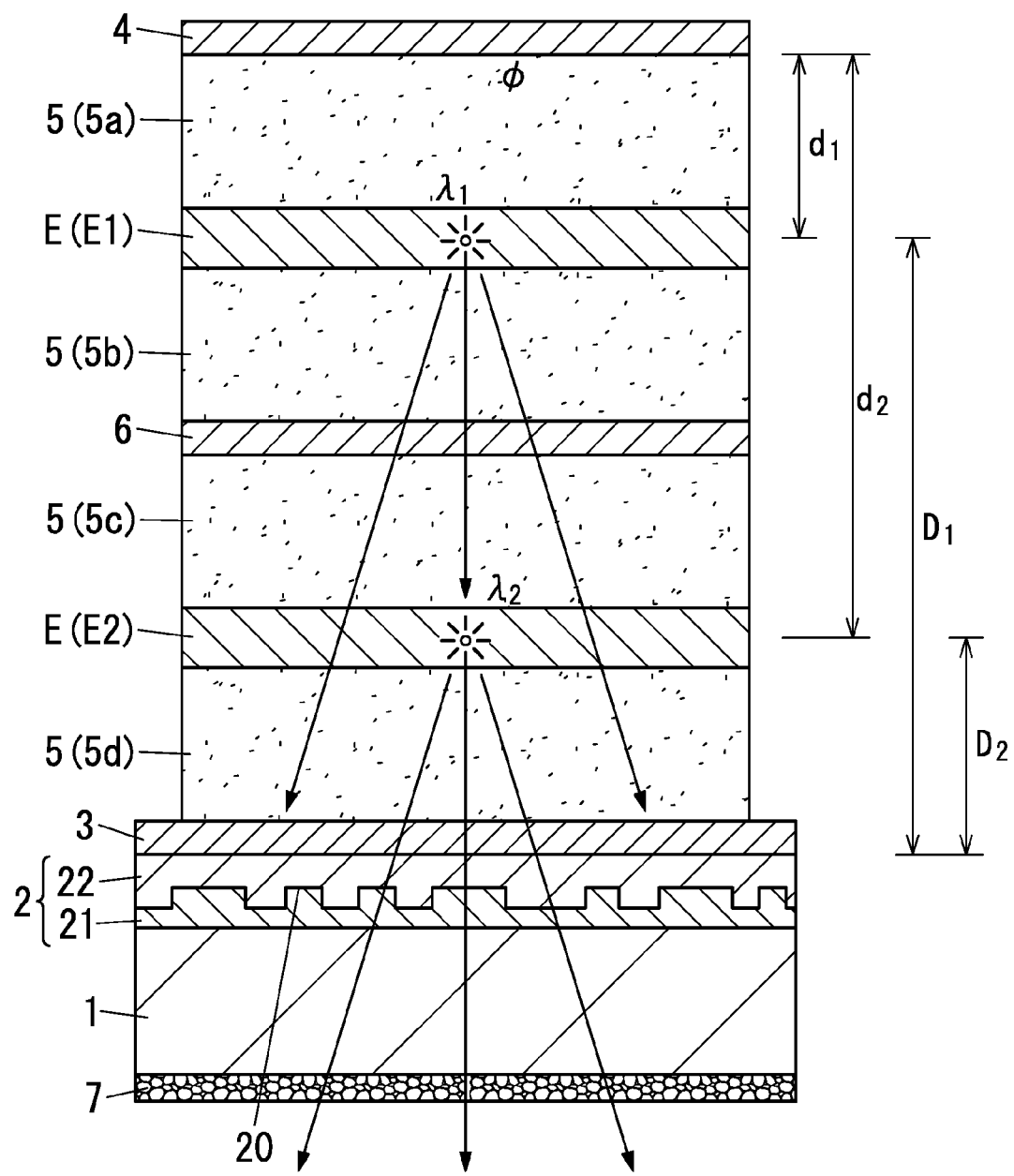
FIG. 3 is a schematic section illustrating another example of one embodiment of the organic electroluminescence element.

FIG. 1 illustrates the first embodiment of the organic electroluminescence element (organic EL element). FIG. 2 illustrates the second embodiment of the organic EL element. FIG. 3 illustrates the third embodiment of the organic EL element. The individual embodiments are described while focusing on common components of the individual embodiments of the organic EL element.

The organic EL element includes a substrate 1 having a light transmissive property, a light diffusion layer 2, a light transmissive electrode 3, a light reflective electrode 4, and multiple light emitting layers E. The light diffusion layer 2 is on a surface of the substrate 1. The light transmissive electrode 3 is on a surface of the light diffusion layer 2. The light reflective electrode 4 is an electrode paired with the light transmissive electrode 3. The multiple light emitting layers E are between the light transmissive electrode 3 and the light reflective electrode 4. The multiple light emitting layers E are spaced from each other. In FIG. 1 to FIG. 4, a single light emitting layer is designated by reference sign E.

The first embodiment and the third embodiment each include two light emitting layers E. With regard to the second embodiment, a middle part of a layer configuration is omitted, and it is explained that there are multiple (two or more) light emitting layers E. These are organic EL elements with multi-unit structures. It is considered that, in the second embodiment, reference signs relating to light emitting layers E are expressed by use of general expressions.

The third embodiment may be a modification of the first embodiment, and further includes a light-outcoupling layer 7 on an opposite surface of the substrate 1 from the light diffusion layer 2.

The present invention is explained with reference to the second embodiment whose reference signs relating to light emitting layers E are expressed by use of general expressions. Note that, the following explanation may be also applied to each embodiment.

In the present description, the light emitting layers E includes the m-th closest light emitting layer E to the light reflective electrode 4, which is referred to as an m-th light emitting layer Em. In this regard, m is an integer equal to or more than 1. For example, the first closest light emitting layer E to the light reflective electrode 4 is referred to as a first light emitting layer E1. Additionally, the second closest light emitting layer E to the light reflective electrode 4 is referred to as a second light emitting layer E2.

$\lambda_m$ represents a weighted average emission wavelength of the m-th light emitting layer Em. For example, a weighted average emission wavelength of the first light emitting layer E1 is represented by $\lambda_1$. Further, a weighted average emission wavelength of the second light emitting layer E2 is represented by $\lambda_2$.

$\phi_m$ represents a phase shift of light produced by the m-th light emitting layer Em caused by the light reflective electrode 4 defined by the following expression (1).

[FORMULA 4]

$$\phi(\lambda_m) = \tan^{-1}\left\{\frac{2(n_s k_r - n_r k_s)}{n_s^2 - n_r^2 + k_s^2 - k_r^2}\right\} \quad (1)$$

In this expression, $n_s$ and $k_s$ represent a refractive index and an extinction coefficient of a layer in contact with the light reflective electrode, respectively, and $n_r$ and $k_r$ represent a refractive index and an extinction coefficient of a reflective layer, and $n_s$, $n_r$, $k_s$, and $k_r$ are functions of $\lambda_m$.

For example, a phase shift of light produced by the first light emitting layer E1 is represented by $\phi_1$. Additionally, a phase shift of light produced by the second light emitting layer E2 is represented by $\phi_2$.

An average refractive index of a medium filling a space between the light reflective layer 4 and the m-th light emitting layer Em is represented by $n_m(\lambda_m)$. For example, an average refractive index of a medium filling a space between the light reflective layer 4 and the first light emitting layer E1 is represented by $n_1(\lambda_1)$. Further, an average refractive index of a medium filling a space between the light reflective layer 4 and the second light emitting layer E2 is represented by $n_2(\lambda_2)$. Such an average refractive index depends on an emission wavelength, and therefore a refractive index is calculated for each emission wavelength.

A distance from the light reflective electrode 4 to the m-th light emitting layer Em is represented by $d_m$. For example, a distance from the light reflective electrode 4 to the first light emitting layer E1 is represented by $d_1$. Further, a distance from the light reflective electrode 4 to the second light emitting layer E2 is represented by $d_2$. The distance $d_m$ denotes a physical distance.

The distances $d_m$ satisfy a relation of $d_1 < d_2 < d_3 < \ldots$.

In the organic EL element, the m-th light emitting layer Em fulfills a relation represented by the following expression (2).

[FORMULA 5]

$$\phi(\lambda_m) \times \frac{\lambda_m}{4\pi} + \frac{l - 0.1}{2}\lambda_m \le n_m(\lambda_m) \times d_m \le \phi(\lambda_m) \times \frac{\lambda_m}{4\pi} + \frac{l + 0.6}{2}\lambda_m \quad (2)$$

In the above expression, l is an integer equal to or more than 0.

In the organic EL element, each of at least two of the multiple light emitting layers E fulfills the relation of the above expression (2). In this regard, it is preferable that all the multiple light emitting layers E fulfill the above expression. Note that, "l" is a lower case of L, and is distinguished from 1 which represents the number one.

Further, in the organic EL element, the m-th light emitting layer Em fulfills a relation represented by the following expression (3).

[FORMULA 6]

$$n_m(\lambda_m) \times d_m \geq 0.6\lambda_m \quad (6)$$

In the organic EL element, it is preferable that each of the multiple light emitting layers E fulfill the relation of the above expression (3).

The relations represented by the above expressions (2) and (3) are made based on optical interference in view of effects caused by plasmon loss. Hence, an amount of light emerging outside can be increased efficiently. As a result, it is possible to obtain the organic EL element which has the enhanced light-outcoupling efficiency and the reduced view angle dependence, and thereby is excellent in the light emitting property.

In this regard, the average refractive index of the medium can be calculated based on the following expression (4).

[FORMULA 7]

$$\tilde{n}(\lambda) = \frac{\sum n_1(\lambda) \times d_1 + n_2(\lambda) \times d_2 + \ldots}{\sum d_m} \quad (4)$$

Note that, in the above expression, d denotes a thickness of one of one or more layers constituting the medium, and n denotes a refractive index of one of one or more layers constituting the medium. m is an integer equal to or more than 1, and indicates one of numbers allocated to the individual layers in order. In this sense, d, n, and m in this expression are different from those of the expressions (1) to (3).

As described in the above expression, the average refractive index of the medium can be interpreted as an average refractive index of a medium with regard to the weighted average emission wavelength λ of a spectrum of a light emitting material, and namely is a thickness-weighted average refractive index.

In this regard, a weighted average emission wavelength is defined as a wavelength calculated by integration of a spectral intensity obtained based on measurement of a spectrum of an intensity of an emission wavelength (emission spectrum), and is exactly represented by the following expression (5).

[FORMULA 8]

$$\lambda_w = \frac{\int_{380}^{780} \lambda * P(\lambda) d\lambda}{\int_{380}^{780} P(\lambda) d\lambda} \quad (5)$$

In this expression, λ denotes a wavelength (nm), and P(λ) denotes a spectral intensity of a corresponding wavelength.

Hereinafter, the phase shift is described. The light emitting layer of the organic EL element is relatively thin and for example has a thickness of several hundred nm, and the thickness is very close to a wavelength of light (wavelength of light in propagating a medium), and therefore thin-film interference may occur inside the organic EL element. As a result, the thickness of the organic layer causes interference with inside light emission, and therefore an intensity of emitted light is greatly increased or decreased. To increase the intensity of emitted light as possible, light (direct light) which directly travels from the light emitting layer to a light emerging side and light (reflected light) which travels from the light emitting layer toward a reflective electrode and then is reflected by this electrode to travel toward the light emerging side are set so as to cause constructive interference. When light is reflected by the reflective layer, there is a phase shift n between rays of light before and after reflection. In view of this, in an ideal model, an optical thickness (optical distance) which is calculated by multiplying a thickness d defined as a distance between a light emitting source and a surface of reflective layer by a refractive index n is set equal to about an odd multiple of ¼π of a wavelength λ of light. By doing so, an amount of a component of light which emerges from the substrate in a front direction is maximized. This design is so-called cavity design. According to this method, light is not amplified inside, but light in a specified direction exemplified by a front direction in which light can easily emerge outside is amplified as a result of changing directions of light. However, actually, the phase shift of light is not equal to π, and shows more complex changes due to refraction and extinction at the organic layer and reflective layer. The phase shift of light in this case is represented by φ. The organic EL element can be designed on the basis of this phase shift φ.

With regard to the distance d between the light emitting layer E and the light reflective electrode 4, in the present description, unless otherwise noted, a center point of the light emitting layer E in the thickness direction thereof and a point at a surface of the light reflective electrode 4 facing the light emitting layer E are used as reference points. In other words, in more exact definition, the distance d should be interpreted as a distance from the surface of the light reflective electrode 4 facing the light emitting layer E to the center of the light emitting layer E in the thickness direction thereof. Light is reflected at the surface of the reflective layer, and therefore it is understandable that the surface of the light reflective electrode 4 is used as the reference point thereof. As for the light emitting layer E, in the strict sense, it is preferable that the reference point is a recombination point of electrons and holes. However, the recombination point may vary depending on material and properties of elements. Further, in many cases the light emitting layer E is relatively thin in view of the proportion of the light emitting layer E to the entire element. Hence, the center of the light emitting layer E may be used as the reference point thereof. Note that, when the recombination point can be determined, the recombination point can be used as the reference point for determining the distance d. For example, the recombination point is not limited to the center in the thickness direction, and can be a surface (a surface facing the light reflective electrode 4 or a surface facing the light transmissive electrode 3).

One or more appropriate layers contributing to operation of the organic EL element may be provided between a certain electrode and the light emitting layer E and the multiple light emitting layers E. For example, such appropriate layers include a charge transport layer 5 and an interlayer 6. FIG. 1 to FIG. 3 show the charge transport layer 5 and the interlayer 6. The charge transport layer 5 may be a layer for injecting and transporting holes or electrons. The interlayer 6 may be a layer for producing charges. In the first to third embodiments, the interlayer 6 is present between the charge transport layers 5. Note that, a bipolar layer may be present between one light emitting layer E and another light emitting layer E. In this case, there is no need to provide the interlayer 6, and the distance between the light emitting layers E can be increased or decreased. Therefore, positions of the light emitting layers E can be easily adjusted.

As shown in FIG. 1 or the like, the charge transport layers 5 are referred to as the first charge transport layer 5a, the second charge transport layer 5b, the third charge transport layer 5c, and the fourth charge transport layer 5d, in ascending order in distance to the light reflective electrode 4. The first charge transport layer 5a may serve as a layer with an electron transport property. The second charge transport layer 5b may serve as a layer with a hole transport property. The third charge transport layer 5c may serve as a layer with an electron transport property. The fourth charge transport layer 5d may serve as a layer with a hole transport property. Note that, such a charge transport layer 5 may have a structure causing charge conversion at its inside.

Besides, the present description mainly gives explanations to elements in which one light emitting unit includes one light emitting layer E. However, one light emitting unit may include a stack of two or more light emitting layers E. When one light emitting unit includes a stack of two or more light emitting layers E, the light emitting layers E may be stacked directly. When one light emitting unit includes a stack of two or more light emitting layers E, one or more light emitting layers E which are excellent in contribution to light emitting properties (i.e., the light-outcoupling efficiency and the color difference) may be designed to fulfill the relations defined by the above expressions (2) and (3). Note that, it is more preferable that all the light emitting layers E fulfill the above expressions (2) and (3).

In the third embodiment, the light-outcoupling layer 7 is provided to the opposite surface of the substrate 1 from the light diffusion layer 2. When the light-outcoupling layer 7 is provided, total reflection at an interface between the substrate 1 and an outside (atmosphere) can be suppressed, and an amount of light emerging outside can be increased.

Note that, a distance from the light emitting layer E to a surface of the light transmissive electrode 3 facing the substrate 1 is represented by D. The reference point of the position of the light emitting layer E for determining the distance D may be same as that for determining the distance d, and may be the center of the light emitting layer E in the thickness direction thereof.

[Design of Element]

With reference to a design model of the organic EL element, it is explained that the aforementioned relations are preferable.

Figure 4:
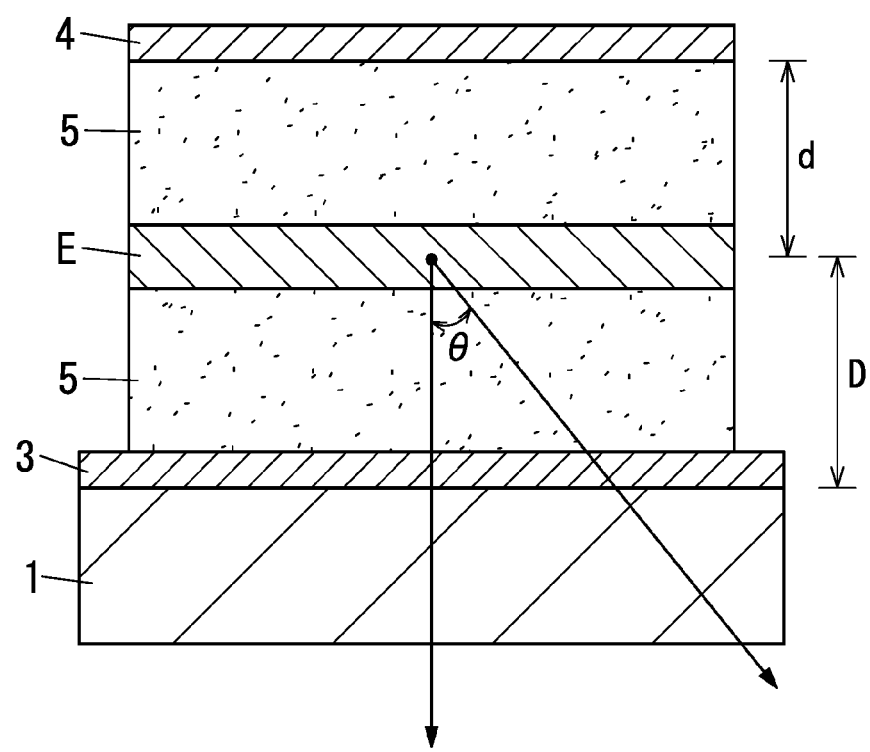
FIG. 4 is a schematic section illustrating a model of the organic electroluminescence element.

FIG. 4 shows the design model of the organic EL element. This design model is used to optimize the organic EL element. This organic EL element includes the substrate 1, the light transmissive electrode 3, the light emitting layer E, and the light reflective electrode 4. This organic EL element includes one light emitting layer E and therefore has a single unit structure. Further, the organic EL element includes the charge transport layer 5. However, the organic EL element is devoid of the light diffusion layer 2. The number of light emitting layers E is one and the light diffusion layer 2 is omitted, and therefore the organic EL element is simplified. Hence, it is possible to optimize the design in view of the light-outcoupling efficiency.

In designing the organic EL element, suppression of the plasmon loss can be considered as one method for improving the light-outcoupling efficiency.

Figure 5:
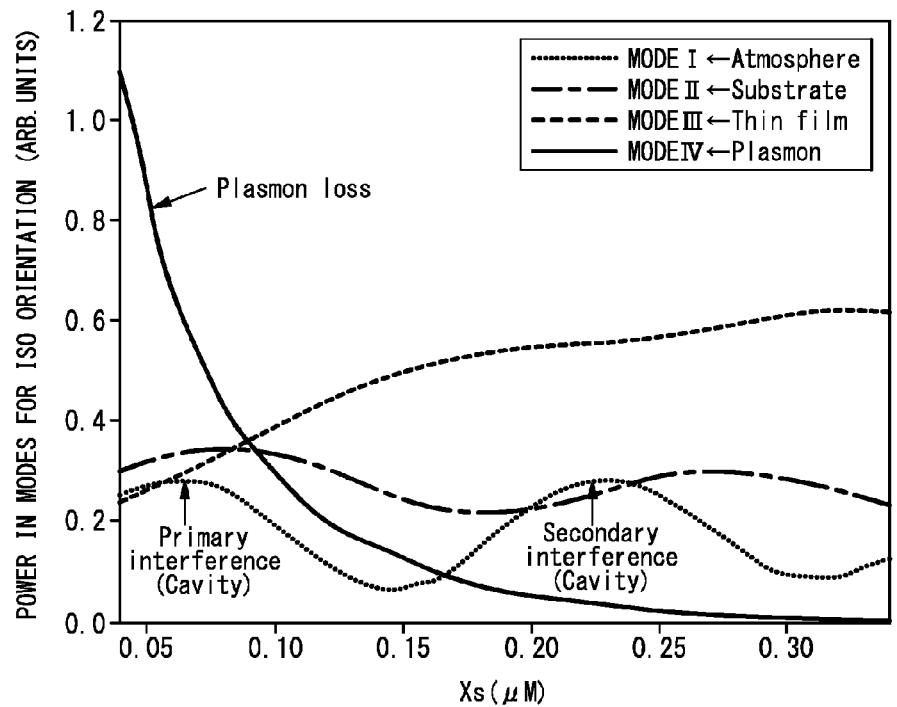
FIG. 5 is a graph illustrating plasmon loss.

The plasmon loss can be described with reference to FIG. 5. FIG. 5 shows a graph illustrating the light-outcoupling efficiencies versus changes in thicknesses between the light emitting source and the reflective layer. This graph shows which mode causes loss of light. MODE I relates to the atmosphere, and indicates interference of light emerging to an outside (atmosphere). Additionally, MODE II, MODE III, and MODE IV relate to the substrate, the thin film, and the plasmon, respectively, and indicate light which is confined inside the element and does not emerge outside. MODE I shows a waveform of interference with a change in the thickness. When the thickness of the cavity was increased, the first order interference, and the second order interference were confirmed. In the thickness corresponding to the first order interference, the plasmon loss is relatively large, and therefore the light-outcoupling efficiency as a whole can be decreased. This is because the reflective layer absorbs light when the distance between the light emitting layer and the reflective layer is too short. It is considered that this absorption of light may increase with an increase in an incident angle. Therefore, it is considered that to causing the second or more order interference for suppressing the plasmon loss is preferable. Due to the effect of suppressing the plasmon loss, improvement of the efficiency can be expected. Note that, the interference (e.g., the third order interference and the fourth order interference) larger in the order than the second interference (second cavity) may cause an increase in radiation lifetime, and this may lead to a decrease in the efficiency. Hence, the order of the interference is preferably small, and for example, the fifth order or less interference may be used.

In the design of the organic EL element, the distance between the light reflective electrode 4 (reflective layer) and the light emitting layer E is considered. In the strict sense, the reference point for the distance of the light emitting layer E is a position at which the light emitting recombination occurs. However, as mentioned above, to facilitate the element design, the reference point may be the center in the thickness direction or the surface of the light emitting layer E. To suppress the plasmon loss, it is preferable that the distance between the reflective layer and the light emitting layer E be increased. In view of this, based on the organic EL element of FIG. 4, the preferable condition for the distance between the light emitting layer E and the reflective layer was determined.

The model of FIG. 4 relates to a single unit element for emitting light of a single color. In this case, the weighted average emission wavelength λ is 600 nm. Which mode light emitted from the light emitting layer E exists is analyzed by use of the distance d between the light emitting layer E and the light reflective electrode 4 as a parameter.

Figure 6:
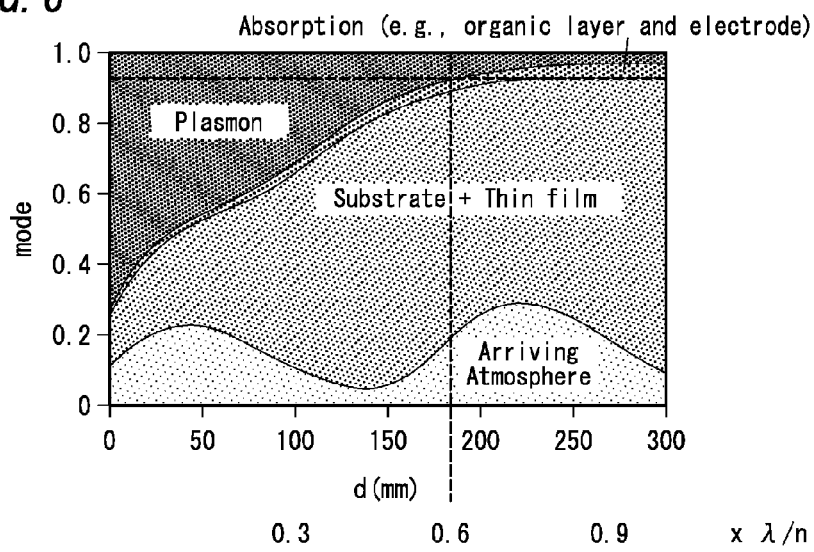
FIG. 6 shows a result of analysis illustrating design based on plasmon loss.

FIG. 6 is a graph showing change in distribution of light produced by the light emitting layer E with change in the distance d between the light emitting layer E and the light reflective electrode 4. In FIG. 6, distributions of respective modes are represented by ratios. As apparent from FIG. 6, it is confirmed that the plasmon loss becomes larger as the light emitting layer E becomes closer to the light reflective electrode 4. In other words, in a region where the distance d is relatively small, light emerging from the light emitting layer E combines with plasmon on a metal surface, and the plasmon mode is facilitated, and a component which does not contribute to light may increase. In contrast, it is understood that the effect of the plasmon loss gradually decreases as the light emitting layer E becomes further from the light reflective electrode 4. In this regard, as for the distance between the light emitting layer E and the light reflective electrode 4, the relation between the wavelength and the refractive index is considered. As shown by the numerical values illustrated below the horizontal axis of the graph, the effect of the plasmon loss is drastically decreased when the distance is equal to or more than about 0.6 times a value (λ/n) obtained by dividing the wavelength (λ) by the refractive index (n). The refractive index in this case is defined as the average refractive index of the medium filling the space between the light reflective electrode 4 and the light emitting layer E. Even in another case where the wavelength and the refractive index are different from the above case, the same effect is obtained. Therefore, it is confirmed that the relation defined by the above expression (3) is preferable.

Note that, the plasmon mode is especially affected by a wide angle component of light (p polarization component) emitted from the light emitting layer E, and in contrast a narrow angle component (light to arrive at the atmosphere) which emerges outside originally does not cause substantial effects on the plasmon mode. In view of this, to increase the light-outcoupling efficiency by suppressing the plasmon loss, it is prerequisite to increase amounts of light in the substrate mode and the thin film mode (light which has a wide incident angle and tends to be totally reflected). Therefore, in the actual organic EL element, it is necessary to provide the light diffusion layer 2. By providing the light diffusion layer 2, the effect of suppressing the plasmon loss is effectively exerted. The light diffusion layer 2 can cause changes in angles of rays of light at the interface between the organic layer and the substrate. The light diffusion layer 2 can suppress components to be totally reflected at the interface between the organic layer and the substrate, and therefore it is possible to increase an amount of light in the thin film mode.

Note that, the above method disclosed in patent literature 1 is to maximize the amount of light emerging in the front direction, and therefore the plasmon loss is not considered. As a result, in some cases, an amount of emerging light may decrease.

In further optimization of the organic EL element, the color difference depending on the view angle (deviation in u'v' coordinates) is considered as one of the properties of the light emitting element in addition to the efficiency (light-outcoupling efficiency). As shown in FIG. 4, the deviation of the color difference is defined as deviation in color between light emerging in the front direction and light emerging at an angle θ. In the organic EL element, light directly emerging from the light emitting layer E and light reflected by an electrode with light reflective properties interfere with each other to cause increase and decrease in light in a certain emerging direction, and therefore a pattern of distribution of light may change. The pattern of distribution of light arriving at the light diffusion layer or the substrate causes direct effects on the efficiency and the color difference. Hence, the distance d between the light emitting layer E and the reflective layer for each light emission color is an important factor for determining the efficiency and the color difference. In view of this, in the present design, mainly, the distance between the light emission position and the reflective layer are controlled precisely to obtain the pattern of distribution of light which realizes the preferable efficiency and color difference.

The organic EL element having a multi-unit structure includes two or more light emitting layers E, and hence the view angle property (suppression of the deviation of the color difference) is important. In view of this, the view angle property of the organic EL element with the multi-unit was confirmed by use of the color difference (Δu'v'). The Δu'v' means a maximum of a root mean square $(\Delta u'^2+\Delta v'^2)^{(1/2)}$ of an amount of the u'v' coordinates of chromaticity deviated from averages in a range in which the view angle relative to the front is equal to or less than 80 degrees. In this regard, "^" is a symbol representing a multiplier. According to the standard of Energy Star (Program Requirements for Solid State Lighting Luminaires, Eligibility Criteria—Version 1.1, 2008), it is preferable that Δu'v' is less than 0.007 in view of a lighting quality.

First, the organic EL element with the multi-unit structure was prepared, experimentally. This prototype has the same layer structure as the first embodiment illustrated in FIG. 1. The whole emission color of this is white. The white emission is important for the lighting use and the like. The first light emitting layer E1 has the weighted average emission wavelength ($\lambda_1$) of 600 nm. The emission color of the first light emitting layer E1 is orange. The second light emitting layer E2 has the weighted average emission wavelength ($\lambda_2$) of 470 nm. The emission color of the second light emitting layer E2 is blue. The medium filling the space between the first light emitting layer E1 and the light reflective electrode 4 has the average refractive index (n) of 1.80, and the extinction coefficient (k) of 0.0005. These refractive index and extinction coefficient are averages with regard to the wavelength $\lambda_1$. The medium filling the space between the second light emitting layer E2 and the light reflective electrode 4 has the average refractive index (n) of 1.80, and the extinction coefficient (k) of 0.0005. These refractive index and extinction coefficient are averages with regard to the wavelength $\lambda_2$. Further, the light reflective electrode 4 is made of Ag. The light reflective electrode 4 has the refractive index (n) of 0.119 and the extinction coefficient (k) of 3.51 with regard to the wavelength $\lambda_1$. Further, the light reflective electrode 4 has the refractive index (n) of 0.135 and the extinction coefficient (k) of 2.66 with regard to the wavelength $\lambda_2$. The light transmissive electrode 3 is of ITO. The light transmissive electrode 3 serves as an anode, and the light reflective electrode 4 serves as a cathode. The substrate 1 is of a glass substrate (the refractive index 1.5). In this organic EL element, to utilize light traveling in a diagonal direction which is largely affected by the plasmon loss, the light diffusion layer 2 is provided between the substrate 1 and the light transmissive electrode 3. By adding the light diffusion layer 2, traveling directions of rays of light are changed, and therefore it is possible to increase an amount of light emerging diagonally.

In this regard, to optimize the distance d, a factor A is introduced. In the present description, with regard to a deviation from the cavity, the factor A defined by the following expression (6) is used.

[FORMULA 9]

$$n(\lambda) \times d = \phi(\lambda) \times \frac{\lambda}{4\pi} + A \times \lambda \qquad (6)$$

The factor A is a numerical value representing how many times the deviation of the distance from the distance of the first order interference is equal to the wavelength in view of the optical distance (n×d). The factor A is represented as a factor indicating the deviation of the distance from the distance of the first order interference. In the graphs described later, each horizontal axis denotes the factor A.

The distance d defining the condition of the first order interference is represented by the following expression (7).

[FORMULA 10]

$$d_1(0) = \phi(\lambda_1) \times \frac{\lambda_1}{4\pi} \times \frac{1}{n} \quad (7)$$

In the first order interference, A is equal to 0. Therefore, in the above expression, the distance $d_1$ when the factor A is equal to 0 is defined as $d_1(0)$. The above expression defines the distance $d_1$ of the first light emitting layer E1. However, the distances of the second and subsequent light emitting layers E can be calculated in a similar manner.

The factor A is represented by the following expression (8) by use of the distances $d_1(A)$ and $d_1(0)$.

[FORMULA 11]

$$A = \frac{n(d_1(A) - d_1(0))}{\lambda_1} \quad (8)$$

Hence, as an expression for determining $d_1(A)$, the following expression (9) is obtained.

[FORMULA 12]

$$d_1(A) = d_1(0) + A \times \frac{\lambda_1}{n} \quad (9)$$

Similarly, as an expression for determining $d_2(A)$, the following expression (10) is obtained.

[FORMULA 13]

$$d_2(A) = d_2(0) + A \times \frac{\lambda_2}{n} \quad (10)$$

The phase difference shift $\phi$ can be obtained as a constant value from the expression (1) by use of the refractive index and the extinction coefficient.

The phase difference shifts $\phi$ of the above element are $\phi(\lambda_1)=0.7\pi$ and $\phi(\lambda_2)=0.58\pi$.

With regard to the factor A, A is equal to 0 in the first order interference, and A is equal to 0.5 in the second order interference, and A is equal to 1 in the third order interference. In summary, A is equal to $0.5 \times (\alpha-1)$ in the $\alpha$-th order interference. Therefore, the relation between the factor A and the distance d can be obtained.

In the above element, when the first light emitting layer E1 is designed for the first order interference, when $\phi_1=0.7\pi$, $\lambda_1=600$, and n=1.80, the expression (7) gives $d_1(0)=58$ nm.

In the above element, when the first light emitting layer E1 is designed for the second order interference, when $\phi_1=0.7\pi$, $\lambda_1=600$, n=1.80, and A=0.5, the expression (9) gives $d_1(0.5)=225$ nm.

In the above element, when the second light emitting layer E2 is designed for the second order interference, when $\phi_2=0.58\pi$, $\lambda_2=470$, n=1.80, and A=0.5, the expression (10) gives $d_2(0.5)=168$ nm.

In the above element, when the second light emitting layer E2 is designed for the third order interference, when $\phi_2=0.58\pi$, $\lambda_2=470$, n=1.80, and A=1, the expression (10) gives $d_2(1)=300$ nm.

Similarly, when the second light emitting layer E2 is designed for the fourth order interference, $d_2(1.5)$ is equal to 430 nm.

As described above, it is possible to optimize the positions of the light emitting layers E in view of the factor A.

The relations obtained by expanding the relation defined by the above expression (2) with regard to the second order interference and the third order interference are shown as follows.

When l is equal to 1, the expression of the first light emitting layer E1 for the second order interference gives the following expression (11).

[FORMULA 14]

$$\phi(\lambda_1) \times \frac{\lambda_1}{4\pi} + 0.45\lambda_1 \leq n_1(\lambda_1) \times d_1 \leq \phi(\lambda_1) \times \frac{\lambda_1}{4\pi} + 0.80\lambda_1 \quad (11)$$

When l is equal to 2, the expression of the second light emitting layer E2 for the third order interference gives the following expression (12).

[FORMULA 15]

$$\phi(\lambda_2) \times \frac{\lambda_2}{4\pi} + 0.95\lambda_1 \leq n_2(\lambda_2) \times d_2 \leq \phi(\lambda_2) \times \frac{\lambda_2}{4\pi} + 1.30\lambda_2 \quad (12)$$

The expressions for the fourth and subsequent order interference can be obtained in a similar manner. In other words, in a case of using the $\alpha$-th order interference, l may be substituted by $\alpha-1$.

Figure 7:
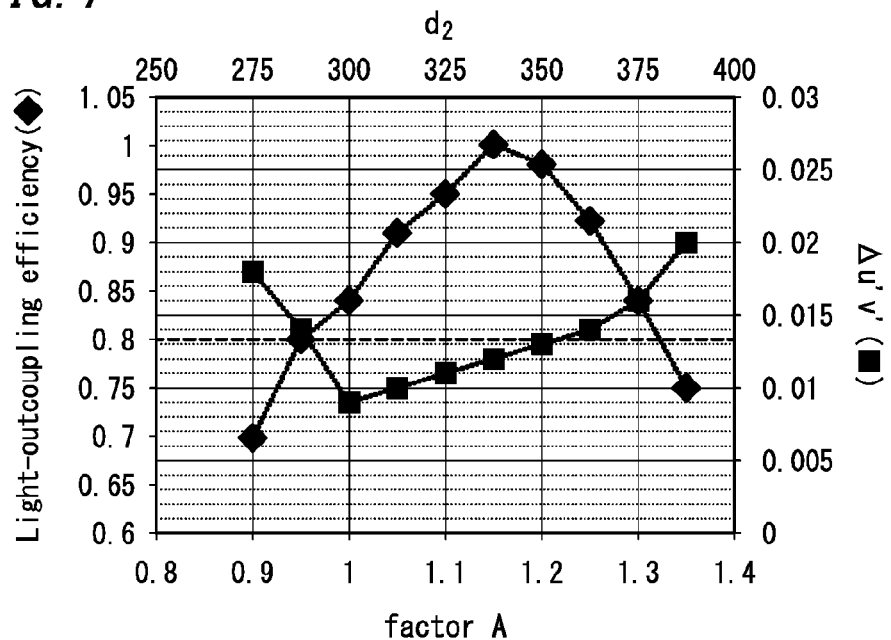
FIG. 7 is a graph illustrating changes in the light-outcoupling efficiency and the color difference versus change in the position of the second light emitting layer.
Figure 8:
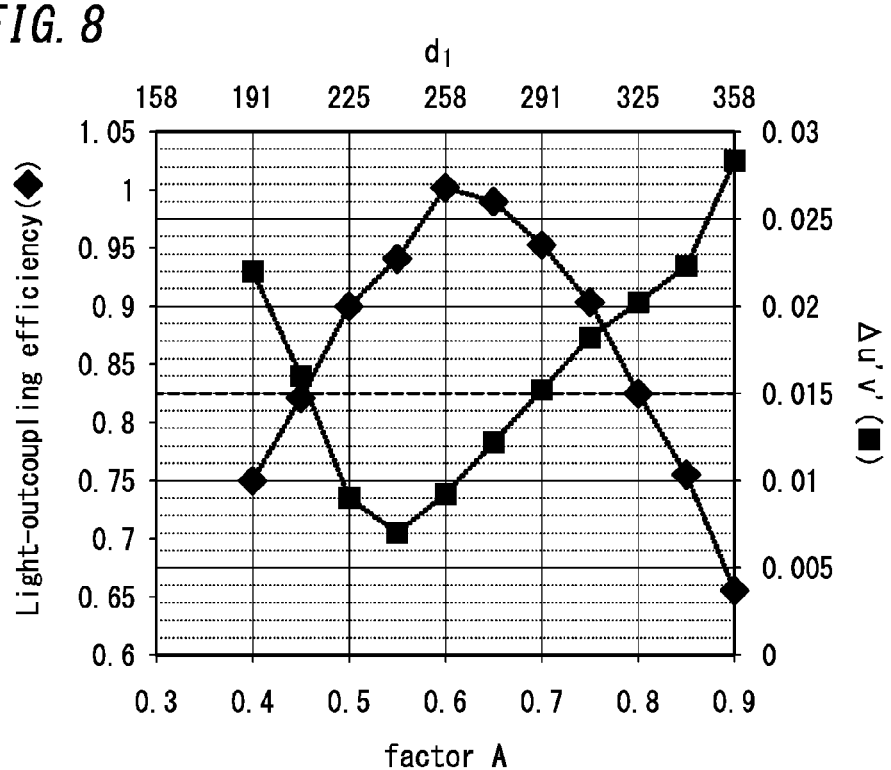
FIG. 8 is a graph illustrating changes in the light-outcoupling efficiency and the color difference versus change in the position of the first light emitting layer.

FIG. 7 and FIG. 8 are graphs showing changes in the light-outcoupling efficiency and the color difference with changes in positions of the light emitting layers E in the organic EL element with the aforementioned multi-unit structure.

FIG. 7 is a graph obtained under a condition where the position of the first light emitting layer E1 is fixed to a position corresponding to the second order interference ($d_1(0.5)=225$ nm) and the position of the second light emitting layer E2 is changed. It is expected that the light property may be improved when the position of the second light emitting layer E2 is near a position corresponding to the third order interference (A=1), and therefore the analysis was conducted in the range of A from 0.9 to 1.4. This element fulfills the relation defined by the above expression (3). As apparent from the graph of FIG. 7, it is confirmed that in the range of A from 0.95 to 1.3, the light-outcoupling efficiency is high and the color difference is low.

FIG. 8 is a graph obtained under a condition where the position of the second light emitting layer E2 is fixed to a position corresponding to the fourth order interference ($d_2(1.5)=430$ nm) and the position of the first light emitting layer E1 is changed. It is expected that the light property may be improved when the position of the first light emitting layer E1 is near a position corresponding to the second order interference (A=0.5), and therefore the analysis was conducted in the range of A from 0.4 to 0.9. This element fulfills the relation defined by the above expression (3). As apparent from the graph of FIG. 8, it is confirmed that in the range of A from 0.45 to 0.8, the light-outcoupling efficiency is high and the color difference is low.

As understood from the results, it is preferable that the position of the light emitting layer E satisfy the relation defined by the expression (2) in accordance with the order of the interference (the order of the cavity).

Note that, in the graphs of FIG. 7 and FIG. 8, peaks show maximum values not in a case where A is set to values (such as 0.5 and 1) corresponding to the interference position, but in a case where A is deviated from such values. This is because the above element allows light to emerge in the substrate mode or the thin film mode due to the presence of the light diffusion layer 2. Further, the cavity effect becomes relatively strong due to constructive interference of wide components of emerging light. This suggests that conditions of A=0.5 or A=1 set according to the interference conditions in the front direction are not always optimal. Therefore, also in the above expression (2), the range is determined so that the center of the range is deviated from the position of the interference (A=0.5 or A=1).

Hereinafter, the optimization of the positions of the light emitting layers E of the organic EL element is further described.

TABLE 1 shows results of the light-outcoupling efficiency and the color difference of the organic EL element with the multi-unit structure obtained by changing the positions of the first light emitting layer E1 and the second light emitting layer E2. The organic EL element includes an orange light emitting layer and a blue light emitting layer.

TABLE 1

|  |  | $d_1$ (nm) | $d_2$ (nm) | Light-outcoupling efficiency | Δu'v' |
|---|---|---|---|---|---|
| Implemented Example | Design Example 1 | 225 (A = 0.5) | 300 (A = 1.0) | 1.07 | 0.008 |
|  | Design Example 2 | 258 (A = 0.6) | 338 (A = 1.15) | 1.39 | 0.011 |
| Comparative Example | Design Example 3 | 58 (A = 0) | 58 (A = 0.08) | 1.00 | 0.032 |
|  | Design Example 4 | 225 (A = 0.5) | 225 (A = 0.72) | 1.03 | 0.044 |

The design examples 1 and 2 are corresponding to implemented examples and the design examples 3 and 4 are comparative examples. In the design examples 1 and 2, the two light emitting layers E are spaced from each other. In the design examples 3 and 4, the two light emitting layer E are in contact with each other.

The design example 3 is designed so that the first light emitting layer E1 is suitable for the first order interference. Therefore, the improvement of the light-outcoupling efficiency caused by the interference effects can be considered. However, the distance between the reflective layer and the light emitting point is small, and does not fulfill the relation defined by the expression (3). Hereinafter, the other design examples are compared with the design example 3 as the reference example.

The design example 4 is designed so that the first light emitting layer E1 is suitable for the second order interference. Therefore, the relation defined by the expression (3) is fulfilled. Thus, the suppression of the plasmon loss is considered. Further, the relation defined by the expression (2) is fulfilled. However, the first light emitting layer E1 and the second light emitting layer E2 are in direct contact with each other, and are not spaced from each other. Consequently, the design example 4 tends to show slight improvement of the light-outcoupling efficiency relative to the design example 3, but may show larger color difference.

The design example 1 is designed so that the first light emitting layer E1 is suitable for the second order interference and the second light emitting layer E2 is suitable for the third order interference. Therefore, the relations defined by the expressions (2) and (3) are fulfilled. In the design example 1, the light-outcoupling efficiency is improved relative to the design example 3, and the color difference is suppressed greatly. Further, comparison with the design example 4 suggests that spacing the light emitting layers E may cause increase in the light-outcoupling efficiency and great improvement of the color difference.

The design example 2 is designed so that the first light emitting layer E1 is suitable for A=0.6 which is slightly deviated from the value corresponding to the second order interference. When a difference in A corresponding to deviation of the position of the first light emitting layer E1 from the interference position is represented by ΔA, ΔA is equal to 0.1. Further, the design example 2 is designed so that the second light emitting layer E2 is suitable for A=1.15 which is slightly deviated from the value corresponding to the third order interference. ΔA which represents deviation of the position of the second light emitting layer E2 from the interference position is equal to 0.15. In the design example 2, the light-outcoupling efficiency is greatly increased relative to the design example 3 and the color difference is greatly suppressed. This suggests that it is preferable that the light emitting layer E be slightly deviated from the interference position so as to cause an increase in the distance. For example, in the range fulfilling the expression (2), ΔA may be equal to or more than 0.05, and further ΔA may be equal to or more than 0.1.

In a case where there are multiple light emitting layers E, it may be difficult that the light emitting layers E with different emission wavelengths fulfill the optimal condition simultaneously when the multiple light emitting layers E are adjusted suitable for the second or subsequent order interference position. Additionally, when the light emitting layers E are stacked, the light emitting points may be deviated from desired positions. Further, there may be a possibility that the color difference increases. Thus, using the multi-unit structure in which the light emitting layers E are spaced each other may facilitate optimization easily.

Preferable Structural Example 1 Derived from Element Design

In the organic EL element produced in line with the above element design, the distance between the first light emitting layer E1 and the light reflective electrode 4 may increase. When a layer (mainly, the first charge transport layer 5a) between the light reflective electrode 4 and the first light emitting layer E1 has a poor charge transport property, the drive voltage may increase with an increase in the thickness of the charge transport layer 5. Especially, when the light reflective electrode 4 serves as a cathode, the charge transport layer 5 includes an electron transport layer. When this layer has a poor electron transport property, the voltage may increase.

Figure 9:
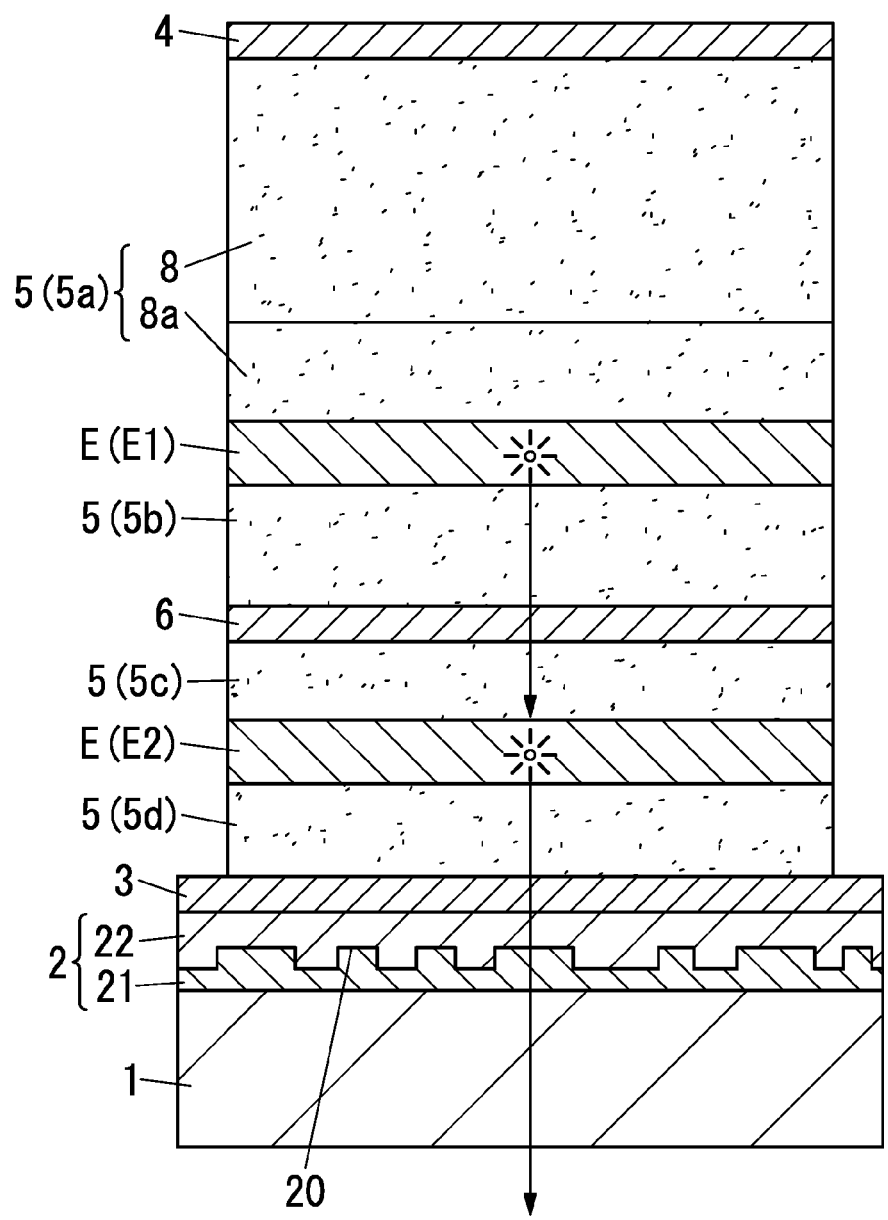
FIG. 9 is a schematic section illustrating another example of one embodiment of the organic electroluminescence element.

In view of this, the organic EL element shown in FIG. 9 is provided as the fourth embodiment corresponding to the structure example 1. This organic EL element includes a carrier transport layer 8 which is between the light reflective electrode 4 and the first light emitting layer E1 and is of a charge transport medium doped with donor material. The first charge transport layer 5a includes part other than the carrier transport layer 8, and this part is a layer of a charge transport medium which is not doped with donor material, and this part is defined as a non-doped layer 8a. In other words, the first charge transport layer 5a is constituted by the carrier transport layer 8 and the non-doped layer 8a. Provision of the carrier transport layer 8 can cause an increase in the charge transport property, and therefore the drive voltage can be lowered.

In the structure example 1, the carrier transport layer 8 is positioned close to the light reflective electrode 4; and the non-doped layer 8a is positioned close to the first light emitting layer E1. Like the structure example 1, it is preferable that the carrier transport layer 8 be not in contact with the light emitting layer E. This is because energy dissipation may occur at an interface between the doped carrier transport layer 8 and the light emitting layer E. When the non-doped layer 8a is placed adjacent to the first light emitting layer E1, effects of the dissipation can be reduced.

When the charge transport medium has an electron transport property, the donor material is n-type donor. When the charge transport medium has a hole transport property, the donor material is p-type donor.

The thickness of the carrier transport layer 8 may be appropriately adjusted for adjustment of a carrier balance in the light emitting layer E. To improve the charge transport property, the carrier transport layer 8 is preferably thicker. For example, it is possible to provide the carrier transport layer 8 with a thickness equal to or more than 10% of a distance between the first light emitting layer E1 and the light reflective electrode 4 (the thickness of the first charge transport layer 5a). In view of reduction of the voltage, it is preferable that the thickness be more increased, and it is more preferable that the thickness of the carrier transport layer 8 be equal to or more than 50%, and be more preferably equal to or more than 90% of the thickness of the first charge transport layer 5a. However, as described above, it is preferable that the light emitting layer E and the carrier transport layer 8 are not in contact with each other. For example, to ensure the non-doped layer 8a with the thickness equal to at least 5% of the thickness of the first charge transport layer 5a, the thickness of the carrier transport layer 8 can be equal to or less than 95% of the thickness of the first charge transport layer 5a.

The doping concentration is adjusted based on the carrier balance, and for example may be in a range of 1% to 30%. When the doping concentration is in this range, the carrier transport property can be improved, and adverse effects such as diffusion of dopants can be reduced.

In the structure example 1, the light reflective electrode 4 may be designed as a cathode, and the light transmissive electrode 3 may be designed as an anode. In this case, the first charge transport layer 5a may be of an electron transport medium. In other words, the carrier transport layer 8 and the non-doped layer 8a have an electron transport property. Further, the donor is an n-type donor. The n-type donor may be alkali metal such as Li and Sc. Alternatively, the donor may be of a donor molecule with an electron transport property as disclosed in U.S. Pat. No. 5,093,698 A. By doping of such donor, the electron transport layer with a high transport property can be obtained.

In the structure example 1, the light reflective electrode 4 may be designed as an anode, and the light transmissive electrode 3 may be designed as a cathode. In this case, the first charge transport layer 5a may be made of a hole transport medium. In other words, the carrier transport layer 8 and the non-doped layer 8a have a hole transport property. Further, the donor may be p-type donor. The p-type donor may be exemplified by F4-TCNQ, FeCl$_3$, and SbCl$_5$. Further, it may be a p-doped layer (e.g., PSS in which PEDOT, PANI, or PPY is dissolved) prepared by application. In the case of using the application type layer, the material is applied so as to form a thick layer, and thereby the carrier transport layer 8 can be formed.

TABLE 2 shows results of comparison of a case where the carrier transport layer 8 is present and a case where the carrier transport layer is absent, with regard to the organic EL element including the light reflective electrode 4 serving as a cathode. The first charge transport layer 5a has a thickness of 200 nm.

The element example A1 corresponds to an example in which the first charge transport layer 5a is constituted by a non-doped type electron injection layer LiF and an electron transport layer. The element examples A2 and A3 correspond to an example in which the first charge transport layer 5a is constituted by the carrier transport layer 8 (n-doped electron injection layer) and the non-doped layer 8a (electron transport layer). The element examples A2 and A3 are different in the thickness of the carrier transport layer 8. TABLE 2 shows that when the carrier transport layer 8 is thicker, the voltage is decreased and the light-outcoupling efficiency is improved.

TABLE 2

|  | Layer structure | Voltage | Light-outcoupling efficiency |
| --- | --- | --- | --- |
| Element example A1 | Cathode/<br>LiF (1 nm)/<br>Electron Transport layer (200 nm)/<br>Light emitting layer | 10 (V) | 1.00 |
| Element example A2 | Cathode/<br>n-doped electron injection layer (50 nm)/<br>Electron Transport layer (150 nm)/<br>Light emitting layer | 9.2 (V) | 1.08 |
| Element example A3 | Cathode/<br>m-doped electron injection layer (180 nm)/<br>Electron Transport layer (20 nm)/<br>Light emitting layer | 7.0 (V) | 1.44 |

Preferable Structural Example 2 Derived from Element Design

Figure 10:
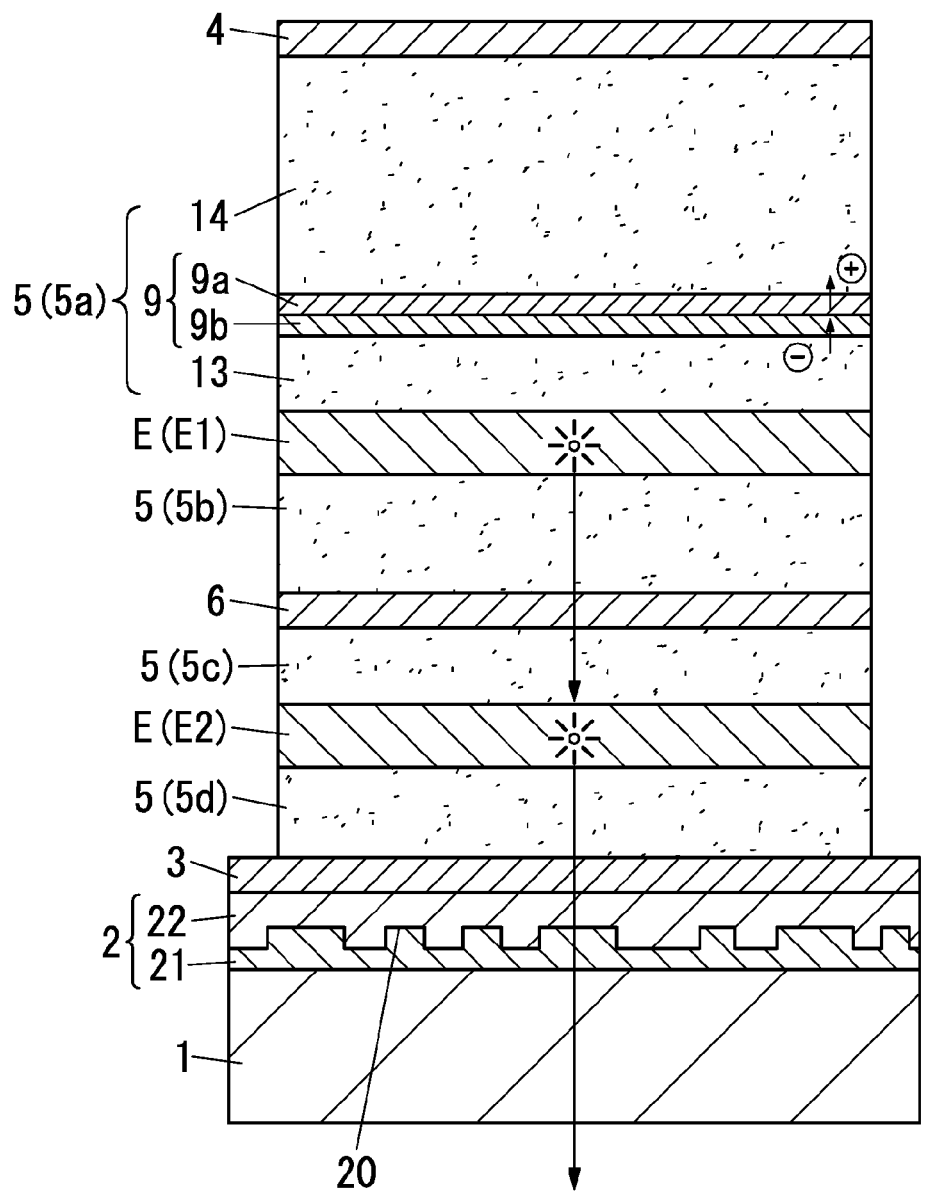
FIG. 10 is a schematic section illustrating another example of one embodiment of the organic electroluminescence element.

The organic EL element shown in FIG. 10 is provided as the fifth embodiment corresponding to the structure example 2 derived from the organic EL element prepared in line with the aforementioned element design. In this organic EL element, the light reflective electrode 4 serves as a cathode, and the light transmissive electrode 3 serves as an anode. Additionally, between the light reflective electrode 4 and the first light emitting layer E1, a charge inversion layer 9 and a hole transport layer 14 are formed in this order from the first light emitting layer E1. In other words, the first charge transport layer 5a includes the charge inversion layer 9 and the hole transport layer 14. Further, it is preferable the first charge transport layer 5a include an electron transport layer 13 which is closer to the first light emitting layer E1 than the charge inversion layer 9 is. In the example of FIG. 10, the first charge transport layer 5a is constituted by the hole transport layer 14, the charge inversion layer 9, and the electron transport layer 13. Charges are inverted, and therefore charges can be transferred by the hole transport layer 14 whose carrier transport property is generally higher than that of the electron transport layer 13. Consequently, the drive voltage can be reduced.

In this regard, carriers transferred by the hole transport layer 14 are holes. Such holes are attracted by negative charges of the cathode (light reflective electrode 4), and then arrive at the cathode. Hence, the light reflective electrode 4 can function as a substantial cathode.

The charge inversion layer 9 may have a multilayered structure in which a hole extraction layer 9a and a blocking layer 9b are arranged in this order from the cathode (light reflective electrode 4). Provision of the hole extraction layer 9a can cause movement of holes. Provision of the blocking layer 9b can allow blocking of a flow of electrons to the cathode, and therefore electrons are substantially transferred to the light emitting layer E. The blocking layer 9b may be made of insulating material. However, the blocking layer 9b should have such an insulating property that electricity is not blocked perfectly, and holes can be extracted from the light emitting layer E and a flow of electrons to the cathode is blocked. The charge inversion layer 9 can be made of known material.

In the structure example 2, it is preferable that the hole transport layer 14 be thicker than the charge inversion layer 9 and the electron transport layer 13. Especially, in this example, carrier transport can be substantially realized by a transport property of the hole transport layer 14. Hence, the thickness of the hole transport layer 14 is preferably equal to or more than 50%, and, in more preferably, is equal to or more than 70% of the distance between the first light emitting layer E1 and the light reflective electrode 4 (the thickness of the first charge transport layer 5a). However, it is necessary to ensure the thicknesses of the charge inversion layer 9 and the electron transport layer 13, and therefore the thickness of the hole transport layer 14 can be equal to or less than 90% of the thickness of the first charge transport layer 5a. The thickness of the charge inversion layer 9 can be adjusted provided that it has a function of inverting charges. For example, the thickness of the charge inversion layer 9 can be in a range of 5% to 30% of the thickness of the first charge transport layer 5a. Further, the thickness of the electron transport layer 13 can be in a range of 5% to 30% of the thickness of the first charge transport layer 5a.

Note that, also in the element in which the light reflective electrode 4 serves as an anode and the light transmissive electrode 3 serves as a cathode, the charge inversion layer 9 can be provided to invert charges so as to allow transport of carriers. Note that, normally, the hole transport layer 14 is higher in a carrier transport property than the electron transport layer 13. Hence, when the charge inversion layer 9 is provided, it is advantageous that the light reflective electrode 4 serves as a cathode.

TABLE 3 shows results of comparison of a case where the charge inversion layer 9 is present and a case where the charge inversion layer 9 is absent, with regard to the organic EL element including the light reflective electrode 4 serving as a cathode. The first charge transport layer 5a has a thickness of 200 nm.

The element example B1 corresponds to an example in which the first charge transport layer 5a is constituted by an electron injection layer LiF and the electron transport layer 13. The element example B2 corresponds to an example in which the first charge transport layer 5a is constituted by the hole transport layer 14, the charge inversion layer 9, and the electron transport layer 13. TABLE 3 shows that inversion of charges causes a decrease in the voltage and improvement of the light-outcoupling efficiency.

TABLE 3

| | Layer structure | Voltage | Light-outcoupling efficiency |
|---|---|---|---|
| Element example B1 | Cathode/ LiF (1 nm)/ Electron Transport layer (200 nm)/ Light emitting layer | 10 (V) | 1.00 |
| Element example B2 | Cathode/ Hole transport layer (150 nm)/ Charge inversion layer (30 nm)/Electron Transport layer (20 nm)/ Light emitting layer | 8.2 (V) | 1.22 |

[Materials of Organic EL Element]

The following explanations are made to materials for making the organic EL element. The organic EL element can be made of appropriate materials normally used for producing the organic EL element.

The substrate 1 may be made of a substrate of glass. Such glass may be soda glass. Non-alkali glass may be used. However, soda glass is generally more inexpensive than non-alkali glass, and offers cost advantage. Further, when the soda glass is used, the light diffusion layer 2 serves as a foundation layer for the organic layer. Hence, it is possible to suppress effects of alkali diffusion on the light transmissive electrode 3 made of ITO or the like.

The light diffusion layer 2 may be a thin film prepared by applying a matrix containing scattering particles, for example. In this case, it is preferable that the refractive index of the matrix of the light diffusion layer 2 be higher as possible, and be equal to or more than the refractive indices of the light emitting layer E and the charge transport layer 5. To improve the light-outcoupling property, it is preferable that the material does not absorb light as possible. The matrix may be resin. Further, to increase the refractive index, inorganic material with a relatively high refractive index such as $TiO_2$ may be mixed with the matrix. Note that, when the matrix has protrusions due to aggregation of particles, short-circuiting is likely to occur. Hence, it is preferable that treatment for preventing deterioration of quality such as coating treatment be done. Additionally, the scattering particles are not limited if they can scatter light together with the matrix. However, it is preferable that the scattering particles do not absorb light. The light diffusion layer 2 can be formed by applying material of the light diffusion layer 2 onto the surface of the substrate 1. As the method of application of material, a coating method such as spin coating, slit coating, bar coating, spray coating, and inkjetting can be used in accordance with the purpose of use and the size of the substrate. Preferable examples of the light diffusion layer 2 are described later.

An organic light emitting stack having a light emitting structure is formed on the light diffusion layer 2. The organic light emitting stack includes an anode, a cathode, and an organic EL layer between the anode and the cathode. In the present description, the organic EL layer is defined as a layer between the anode and the cathode. The organic EL layer may be constituted by a hole transport layer, a light emitting layer, an electron transport layer, and an electron injection layer, which are arranged in this order from the anode, for example. In the organic EL element, the light transmissive electrode 3 may serve as the anode, and the light reflective electrode 4 may serve as the cathode.

The stack structure of the organic EL layer is not limited to the aforementioned example. For example, the organic EL layer may have a single layer structure of a light emitting layer, a stack structure of a hole transport layer, a light emitting layer, and an electron transport layer, a stack structure of a hole transport layer and a light emitting layer, and a stack structure of a light emitting layer and an electron transport layer. Further, a hole injection layer may be provided between the anode and the hole transport layer. Further, the light emitting layer may have a single layer structure or a multilayer structure. For example, when desired emission color is white, the light emitting layer may be doped with three types of dopant pigments of red, green, and blue. Alternatively, the light emitting layer may have a stack structure of a blue hole transport light emitting layer, a green electron transport light emitting layer, and a red electron transport light emitting layer, or a stack structure of a blue electron transport light emitting layer, a green electron transport light emitting layer, and a red electron transport light emitting layer. Further, a multi-unit structure may be used. In the multi-unit structure, multiple light emitting units are stacked with light transmissive and conductive interlayers in-between, and each light emitting unit is defined as an organic EL layer having a function of emitting light in response to application of voltage between an anode and a cathode. The multi-unit structure means a structure in which multiple light emitting units which are stacked in the thickness direction and electrically connected in series with each other are positioned between one anode and one cathode.

The anode is an electrode for injecting holes. The anode may be preferably made of an electrode material with a large work function, such as metal, alloys, electrically conductive compounds, and mixtures thereof. Further, to avoid a situation where a difference between a work function of the material of the anode and the HOMO (Highest Occupied Molecular Orbital) level becomes excessively large, the work function of the material of the anode preferably is equal to or more than 4 eV and equal to or less than 6 eV. The electrode material of the anode may be selected from metal oxide (e.g., ITO, tin oxide, zinc oxide, and IZO), a metal compound (e.g., copper iodide), conductive polymer (e.g., PEDOT and polyaniline), conductive polymer doped with arbitrary acceptors, and conductive light transmissive material (e.g., carbon nanotube). In this regard, the anode may be a thin film formed on the surface of the light diffusion layer 2 provided on the substrate 1, by sputtering, vacuum deposition, or coating. Note that, a sheet resistance of the anode is preferably equal to or less than several hundred $\Omega/\square$, and more preferably is equal to or less than $100\Omega/\square$. Further, a thickness of the anode may be equal to or less than 500 nm, and may be preferably in a range of 10 nm to 200 nm. Light transmissivity tends to increase with a decrease in the thickness of the anode, but the sheet resistance tends to increase with a decrease in the thickness. When the size of the organic EL element is increased, a high voltage may be required, and luminance uniformity may become poor (caused by non-uniformity of a current density distribution resulting from a drop in voltage). To avoid this trade-off, generally it is effective to form, on the light transmissive anode, an auxiliary electrode (grid) which is made of metal. Preferably, the material is excellent in electric conductivity, and may be selected from metals such as Ag, Cu, Au, Al, Rh, Ru, Ni, Mo, Cr, and Pd, and an alloy of these metals such as MoAlMo, AlMo, and AgPdCu. In this case, to prevent such a metal grid from acting as light blocking member, the surface of the grid part may be more preferably subjected to insulating treatment so as to block a current flow from the grid part to the cathode. Further, to minimize the effects of absorption of diffused light by the grid, it is preferable that metal used for the grid be high reflectivity as possible.

When the anode is formed by use of ITO, a film of ITO may be preferably formed at a temperature equal to or more than 150° C. which causes crystallization of ITO. Alternatively, a film of ITO may preferably be formed at a low temperature and then subjected to annealing (equal to or more than 150° C.). Crystallization causes an increase in conductivity, and therefore the aforementioned trade-off condition may be eased. The structure becomes dense, and therefore effects of suppressing outgas (e.g., water vapor) which occurs when the light diffusion layer 2 is made of resin, from reaching the organic EL layer can be expected.

Examples of a material for making the hole injection layer include: a hole injection organic material and metal oxide; and an organic material and inorganic material used as material for acceptor; and a p-doped layer. The hole injection organic material is a material that has hole transport properties, a work function of 5.0 eV to 6.0 eV, and strong adherence to the anode, and is CuPc, starburst amine, or the like, for example. A hole injection metal oxide is, for example, a metal oxide that includes any of molybdenum, rhenium, tungsten, vanadium, zinc, indium, tin, gallium, titanium, and aluminum. Not only an oxide of a single metal, it may be a composite metal oxide that include any one of sets including a set of indium and tin, a set of indium and zinc, a set of aluminum and gallium, a set of gallium and zinc, and a set of titanium and niobium. The hole injection layers made of these materials may be formed by a dry process such as vapor deposition, a transfer method, or may be formed by a wet process such as spin coating, spray coating, dye coating, or gravure printing.

A material for making the hole transport layer can be selected from a group of compounds with hole transportability. Examples of the compounds with hole transportability include arylamine compounds (e.g., 4,4'-bis[N-(naphthyl)-N-phenyl-amino]biphenyl ($\alpha$-NPD), N,N'-bis(3-methylphenyl)-(1,1'-biphenyl)-4,4'-diamine (TPD), 2-TNATA, 4,4',4''-tris(N-(3-methylphenyl)N-phenylamino) triphenylamine (MTDATA), 4,4'-N,N'-dicarbazolebiphenyl (CBP), spiro-NPD, spiro-TPD, spiro-TAD, and TNB), an amine compound that contains a carbazole group, and an amine compound that contains a fluorene derivative. However, an arbitrary hole transport material that is generally known is available.

The light emitting layer E may be made of appropriate material known as materials for the organic EL element. Examples of materials of the light emitting layer E include anthracene, naphthalene, pyrene, tetracene, coronene, perylene, phthaloperylene, naphthaloperylene, diphenylbutadiene, tetraphenylbutadiene, coumalin, oxadiazole, bisbenzoxazoline, bisstyryl, cyclopentadiene, quinoline-metal complex, tris(8-hydroxyquinolinate)aluminum complex, tris (4-methyl-8-quinolinate)aluminum complex, tris(5-phenyl-8-quinolinate)aluminum complex, aminoquinoline-metal complex, benzoquinoline-metal complex, tri-(p-terphenyl-4-yl)amine, 1-aryl-2,5-di(2-thienyl)pyrrole derivative, pyrane, quinacridone, rubrene, distyrylbenzene derivative, distyrylarylene derivative, distyrylamine derivative, various fluorescent pigments, the other materials containing one or more of the above materials, and the derivatives thereof, but are not limited to the aforementioned examples. Further, it is also preferable that light emitting materials selected from the above compounds be mixed. In addition to compounds causing fluorescence represented by the aforementioned compounds, materials providing light emission due to spin multiplet, such as phosphorescent material causing phosphorescence and compounds containing parts thereof in molecules may be used. Note that, the light emitting layer E of the above materials may be formed by a dry process such as a vapor deposition method and a transfer method, or by a wet process such as a spin coating method, a spray coating method, a dye coating method, and a gravure printing method.

The interlayer 6 may be made of material capable of providing charges to the corresponding light emitting unit. To allow light to emerge, the interlayer 6 is preferably light transmissive. For example, the interlayer 6 may be a metal thin film. The material of the interlayer 6 may be exemplified by silver and aluminum. Alternatively, the interlayer 6 may be made of organic material.

A material for the electron transport layer can be selected from a group of compounds with electron transportability. Examples of the compounds with an electron transportability include a metal complex that is known as an electron transportable material (e.g., $Alq_3$), and a heterocyclic compound (e.g., a phenanthroline derivative, a pyridine derivative, a tetrazine derivative, and an oxadiazole derivative). However, an arbitrary electron transport material that is generally known can be used.

A material for the electron injection layer is arbitrarily selected from the following examples. Examples of the material for the electron injection layer include: metal halides such as a metal fluoride (e.g., lithium fluoride and magnesium fluoride) and metal chloride (e.g., sodium chloride and magnesium chloride); and metal oxide; and metal nitride; and metal carbide; and metal oxynitride; and a carbon compound; and a silicon compound (e.g., $SiO_2$ and SiO). Examples of metal for the metal oxide, the metal nitride, the metal carbide, and the metal oxynitride include aluminum, cobalt, zirconium, titanium, vanadium, niobium, chromium, tantalum, tungsten, manganese, molybdenum, ruthenium, iron, nickel, copper, gallium, zinc, and silicon. More specific examples of the metal oxide, the metal nitride, the metal carbide, and the metal oxynitride include a compound to serve as insulators such as aluminum oxide, magnesium oxide, iron oxide, aluminum nitride, silicon nitride, silicon carbide, silicon oxynitride, and boron nitride. These materials can be formed into a thin film by vacuum vapor deposition, sputtering, or the like.

The cathode is an electrode for injecting electrons into the light emitting layer. The cathode may be preferably made of an electrode material with a small work function, such as metal, alloys, electrically conductive compounds, and mixtures thereof. Further, to avoid a situation where a difference between a work function of the material of the cathode and the LUMO (Lowest Unoccupied Molecular Orbital) level becomes excessively large, the work function of the material of the cathode preferably is equal to or more than 1.9 eV and equal to or less than 5 eV. The electrode material of the cathode may be selected from aluminum, silver, magnesium, and an alloy of one or more of these metals and other metal (e.g., an amalgam of magnesium and silver, an amalgam of magnesium and indium, and an alloy of aluminum and lithium). Alternatively, the electrode material of the cathode may be selected from conductive material of metal, metal oxide, and a mixture of one or more of these and other metal. For example, the cathode may be a stack film of an ultra-thin film of aluminum oxide (a thin film of a thickness equal to or less than 1 nm which allows flow of electrons due to tunnel injection) and a thin film of aluminum.

In the organic EL element, the light emitting stack is preferably hermetically enclosed by enclosing material. The organic EL layer is weak in water. Therefore, to avoid contact of the organic EL layer and air, the organic EL layer side of the substrate 1 is enclosed by use of a glass cap inside a dew point controlled glove box (e.g., a dew point is kept equal to or less than −70° C.). In this regard, when desiccant or the like is included inside the enclosure, preservation lifetime can be more prolonged.

The light-outcoupling layer 7 may be provided to the opposite side of the substrate 1 from the light diffusion layer 2. By doing so, it is possible to suppress total reflection loss at an interface between the substrate and the atmosphere. The light-outcoupling layer 7 may be a diffusion film, a prism sheet, a micro lens sheet, or the like which is to be attached with adhesive. Alternatively, the light-outcoupling layer 7 may be an optical diffusion structure (e.g., fine recesses and protrusions) obtained by direct processing such as blasting and etching on the substrate 1.

[Light Diffusion Layer]

In the organic EL element, the light diffusion layer 2 is provided to suppress total reflection at an interface between the organic layer and the substrate, and thereby an amount of light emerging outside can be increased. Therefore, by optimizing the light diffusion layer 2, the light-outcoupling efficiency can be more improved. The light diffusion layer 2 is made of transparent material.

Hereinafter, preferable examples of the light diffusion layer 2 are described.

The light diffusion layer 2 preferably includes a first transparent material layer 21 and a second transparent material layer 22 which are arranged in this order from the substrate 1. In this case, it is possible to easily form an uneven structure 20 at an interface between these two layers. Preferably, the second transparent material layer 22 is higher in a refractive index than the substrate 1. In this case, a difference in a refractive index is reduced, and therefore the light-outcoupling efficiency can be improved more. It is preferable that the uneven structure 20 be formed at the interface between the first transparent material layer 21 and the second transparent material layer 22. When the light diffusion layer 2 with multiple layers having the uneven structure 20 at its interface is used, light is diffused by the uneven structure 20, and therefore the light-outcoupling efficiency can be more improved.

Further, when the light diffusion layer 2 is constituted by the two transparent material layers 21 and 22, the second transparent material layer 22 functions as a covering layer, and therefore provides a flat surface above the uneven structure 20. Hence, it is possible to form the light emitting stack stably. Consequently, disconnection and short-circuiting caused by recesses and protrusions can be suppressed. Further, in a case where the covering layer is provided, even when the uneven structure which is relatively tall (deep) is provided, it is possible to form the light emitting stack finely. As described above, the second transparent material layer 22 can serve as a flattening layer, and therefore it is preferable to provide the second transparent material layer 22. Further, the transparent material layers 21 and 22 are transparent and thus light transmissive, and as a result light can emerge effectively.

With regard to the second transparent material layer 22, a refractive index $n_H$ for a visible wavelength range is preferably equal to or more than 1.75. In this case, a difference in a refractive index is more reduced, and therefore total reflection loss can be suppressed in a wide range of angles. Thus, an amount of emerging light can be increased. For example, the refractive index $n_b$ of the substrate 1 is in a range of 1.3 to 1.55. It is also preferable that the refractive index $n_H$ of the second transparent material layer 22 be equal to or more than the refractive index (the average refractive index) of the organic EL layer. For example, the average refractive index of the organic EL layer is in a range of 1.6 to 1.9. This average refractive index may be for the visible wavelength range. There is no upper limit for the refractive index $n_H$, but the upper limit may be 2.2, and in particular 2.0, for example. Further, it is preferable to decrease a difference in a refractive index between the second transparent material layer 22 and the light transmissive electrode 3 which is an adjacent layer to the second transparent material layer 22. For example, such a difference in a refractive index may be equal to or less than 1.0.

With regard to the first transparent material layer 21, a refractive index $n_L$ for a visible wavelength range is preferably in a range of 1.3 to 1.5. In this case, an amount of emerging light can be increased. A difference between the refractive indices of the first transparent material layer 21 and the substrate 1 is preferably smaller. For example, this difference between the refractive indices may be equal to or less than 1.0. Further, it is also preferable that the refractive index $n_L$ of the first transparent material layer 21 be lower than the refractive index of the substrate 1. In this case, it is possible to suppress total reflection at an interface between the first transparent material layer 21 and the substrate 1. Note that, when the light diffusion layer 2 is provided, light is allowed to emerge due to diffusion of light. Therefore, the first transparent material layer 21 may be higher in a refractive index than the substrate 1.

The substrate 1 and the first transparent material layer 21 preferably have a lower refractive index (its lower limit is 1 which is equal to the atmosphere). As the refractive index becomes close to 1, total reflection at an interface between the substrate 1 and the atmosphere is more unlikely to occur. Therefore, even when the light-outcoupling layer 7 is not provided, light is allowed to emerge. Hence, the structure can be more simplified. The first transparent material layer 21 preferably has higher light transmissivity. For example, the transmissivity of the first transparent material layer 21 may allow transmission of 80% of visible light, and preferably may allow transmission of 90% of visible light.

In the light diffusion layer 2, for example, the first transparent material layer 21 may serve as a layer with a relatively low refractive index, and the second transparent material layer 22 may serve as a layer with a relatively high refractive index. It is more preferably that the refractive index $n_L$ for the visible wavelength range of the first transparent material layer 21 be in a range of 1.3 to 1.5 and the refractive index $n_H$ for the visible wavelength range of the second transparent material layer 22 is preferably equal to or more than 1.75.

The light diffusion layers 2 (the first transparent material layer 21 and the second transparent material layer 22) are preferably made of resin. In this case, the refractive index can be adjusted easily, and it is possible to facilitate formation of protrusions and recesses and flattening of protrusions and recesses. When a layer is made of resin material, the layer can have a relatively high refractive index. Further, such a layer can be formed by application of resin, and part of the resin is allowed to intrude into recesses, and thus it is possible to easily form a layer with a flat surface.

The first transparent material layer 21 may be made of organic resin such as acrylic resin and epoxy resin. Additionally, additive for curing the resin (e.g., curing agent, curing accelerator, and curing initiator) may be added to the resin. Further, an extinction coefficient k of the material of the first transparent material layer 21 is preferably small as possible, and is more preferably equal to zero (or a value which is too small to measure) ideally. Therefore, preferably, the extinction coefficient k of the first transparent material layer 21 is equal to zero with regard to the entire visible wavelength range. However, the allowable range of the extinction coefficient may be set in accordance with a thickness of a layer made of this material. Note that, the material other than the resin may include inorganic material. For example, the first transparent material layer 21 may be made of spin-on glass.

The second transparent material layer 22 may be made of resin into which high refractive nanoparticles such as $TiO_2$ are dispersed. The resin may be organic resin such as acrylic resin and epoxy resin. Additionally, additive for curing the resin (e.g., curing agent, curing accelerator, and curing initiator) may be added to the resin. Further, an extinction coefficient k of the material of the second transparent material layer 22 is preferably small as possible, and is more preferably equal to zero (or a value which is too small to measure) ideally. Note that, the material other than the resin may include an inorganic film made of SiN and a film of inorganic oxide (e.g., $SiO_2$).

The surface provided by the second transparent material layer 22 (surface of the second transparent material layer 22 facing the light transmissive electrode 3) is preferably flat. In this case, short-circuit and failure in stacking caused by recesses and protrusions can be suppressed, and it is possible to provide the light emitting stack successfully.

Note that, if the light emitting property or the like is sufficient even when the second transparent material layer 22 is not provided, the second transparent material layer 22 may be omitted. When the second transparent material layer 22 is not provided, it is possible to reduce the number of layers, and therefore it is possible to more easily produce the element. For example, if the first transparent material layer 21 has level differences between protrusions and recesses thereof to an extent that the level differences do not affect films to be formed above the first transparent material layer 21, the second transparent material layer 22 may be omitted. Even when the second transparent material layer 22 is not provided, the light-outcoupling efficiency can be improved by the light diffusion layer 2 constituted by the uneven structure 20. However, to suppress short-circuiting and disconnection, it is preferable to form the second transparent material layer 22 as described above.

The first transparent material layer 21 and the second transparent material layer 22 can be provided to on the surface of the substrate 1 by applying materials therefor. The applying method of this material may be appropriate coating such as spin coating, slit coating, bar coating, spray coating, and inkjetting, which may be selected in accordance with usage or a substrate size.

The uneven structure 20 between the first transparent material layer 21 and the second transparent material layer 22 can be formed in an appropriate manner. For example, particles such as beads are mixed in the transparent material, and thereby protrusions and recesses can be given by shapes of the particles. Further, it is preferable that protrusions and recesses of the uneven structure 20 be formed by imprint lithography. By using the imprint lithography, it is possible to form fine protrusions and recesses efficiently and precisely. Further, in the case of forming protrusions and recesses by allocating the protruded part or the recessed part to each uneven section as described later, it is possible to form fine protrusions and recesses highly precisely by use of the imprint lithography. In a case of forming protrusions and recesses by the imprint lithography, one uneven section may be formed by one dot of printing. It is preferable to use the imprinting lithography allowing formation of fine structures, and for example, so-called nanoimprint lithography is preferable.

The imprint lithography is divided into major categories which are UV imprint lithography and thermal imprint lithography, and either the UV imprint lithography or the thermal imprint lithography is available. In the implemented embodiment, for example, the UV imprint lithography is used. By the UV imprint lithography, it is possible to easily print (transfer) recesses and protrusions to form the uneven structure. In the UV imprint lithography, for example, a film mold which is formed by impressing of a Ni master mold patterned to have a rectangular (pillar) structure of 2 μm in interval and 1 μm in height is used. UV curable imprint transparent resin is applied onto a substrate, and the mold is pressed against a surface of a resin layer on this substrate. Thereafter, to cure the resin, the resin is irradiated with UV light (e.g., i-line with wavelength λ=365 nm) which passes through the substrate or the film mold. After the resin is cured, the mold is removed. In this process, it is preferable that the mold be preliminarily subjected to treatment for facilitating removal (e.g., fluorine coating treatment). Thus, it is possible to easily remove the mold from the substrate. Therefore, the recesses and protrusions structure on the mold can be transferred to the substrate. Note that, this mold includes recesses and protrusions corresponding to the shape of the uneven structure 20. When the recesses and protrusions structure of the mold is transferred, the desired recesses and protrusions structure is provided to the surface of the transparent material layer. For example, when the mold in which the recessed parts are randomly allocated to desired sections is used, it is possible to obtain the uneven structure 20 in which the protruded parts are randomly allocated.

Figure 11A:
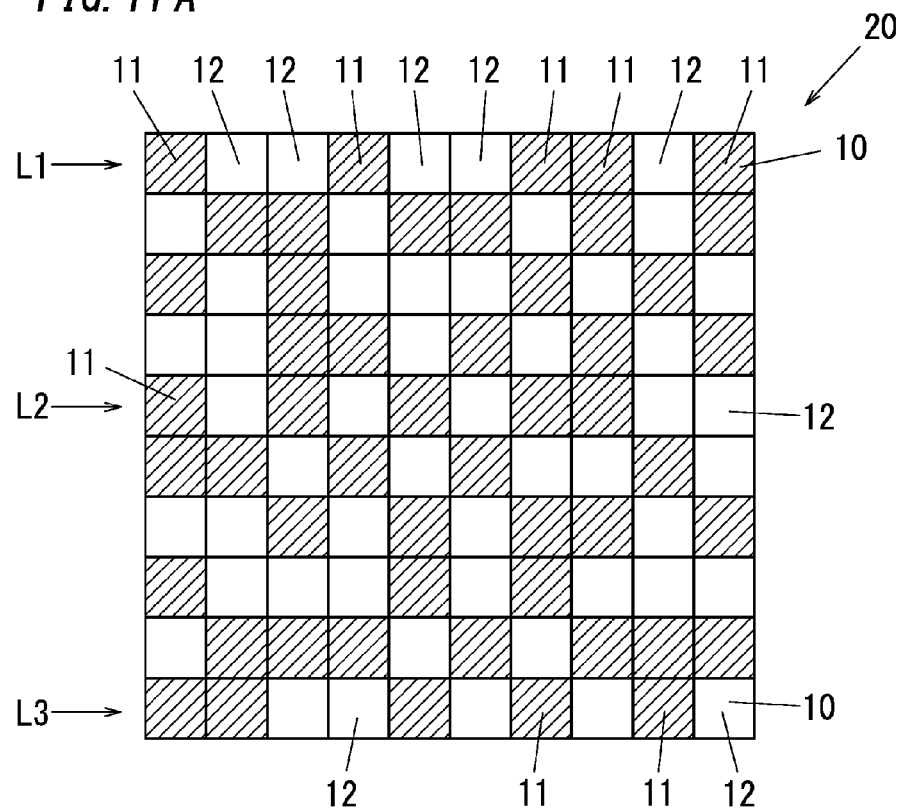
FIG. 11A is an explanatory view illustrating an example of the uneven structure and a plan thereof.
Figure 11B:
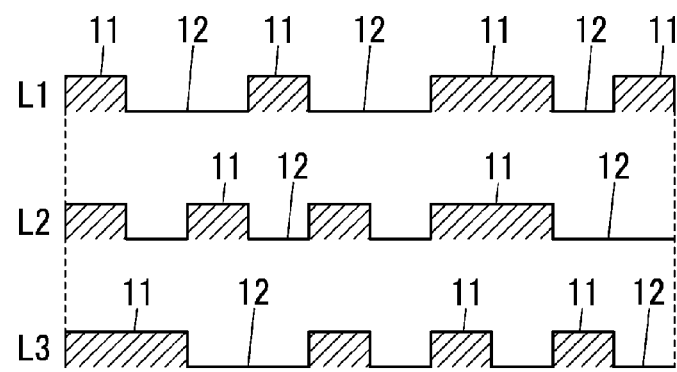
FIG. 11B is an explanatory view illustrating the example of the uneven structure and a section thereof.

FIG. 11A and FIG. 11B show an example of the uneven structure 20 of the light diffusion layer 2. The uneven structure 20 in the light diffusion layer 2 is preferably defined by an aggregate of protruded parts 11 or recessed parts 12 arranged in plane. In this case, the light diffusion effects can be improved without causing angle dependency, and therefore it is possible to increase an amount of emerging light. The plane where the protruded parts 11 or the recessed parts 12 are arranged may be parallel with the surface of the substrate 1. FIG. 11A and FIG. 11B show that the protruded parts 11 are arranged in plane. In a different viewpoint, FIG. 11A and FIG. 11B show that the recessed parts 12 are arranged in plane. The uneven structure 20 may be defined by an aggregate of protruded parts 11 and recessed parts 12 arranged in plane.

With regard to the uneven structure 20 in the light diffusion layer 2, as shown in FIG. 11A and FIG. 11B, it is preferable that the aggregate of the protruded parts 11 or the recessed parts 12 has a plane divided into an array of sections 10, and the protruded parts 11 or the recessed parts 12 are arranged by being individually allocated to sections 10 randomly selected from the array. In this case, the light diffusion effects can be improved without causing angle dependency, and therefore it is possible to increase an amount of emerging light. In one example of the sections 10 of the array, each section has a quadrangular shape. The quadrangular shape is preferably a square shape. In this case, the array is a matrix array (square array) in which multiple quadrangles are arranged in rows and columns with no space in-between. In another example of the sections 10 of the array, each section has a hexagonal shape. The hexagonal shape is preferably a regular hexagonal shape. In this case, the array is a honeycomb array (hexagonal grid) in which multiple hexagons are arranged with no space in-between. Alternatively, the array may be a triangular array in which multiple triangles are arranged with no space in-between. However, the square array and the hexagonal array allow easy control of the protrusions and the recesses.

The uneven structure 20 shown in FIG. 11A and FIG. 11B includes a plane divided into a matrix of sections (the array of sections 10) to be protruded or recessed, and multiple protruded parts 11 have almost same heights which are individually allocated to desired sections of the matrix so that the multiple protruded parts 11 are arranged in the plane. Additionally, in the uneven structure 20, with regard to an arbitrary region of the plane, a ratio of a total area of one or some of the multiple protruded parts 11 in the arbitrary region to an area of the arbitrary region is almost constant. By providing such an uneven structure 20, the light-outcoupling efficiency can be improved efficiently.

FIG. 11A and FIG. 11B show an example of the uneven structure 20. FIG. 11A shows a view in a direction perpendicular to the surface of the substrate 1, and FIG. 11B shows a view in a direction parallel to the surface of the substrate 1. In FIG. 11A, the sections where the protruded parts 11 are provided are illustrated with hatching. Structures indicated by lines L1, L2, and L3 in FIG. 11A correspond to structures indicated by lines L1, L2, and L3 in FIG. 11B, respectively.

As shown in FIG. 11A, the uneven structure 20 is constituted by arrangement of the protruded parts 11 allocated to desired uneven sections of a matrix of uneven sections which are multiple squares (rows and columns) arranged in length and width directions. The uneven sections have the same area. Either one protruded part 11 or one recessed part 12 is allocated to one section (one uneven section) to be recessed or protruded. The protruded parts 11 may be allocated regularly or randomly. In the implemented embodiment of FIG. 11A and FIG. 11B, the protruded parts 11 are allocated randomly. As shown in FIG. 11B, in the section to which the protruded part 11 is allocated, the protruded part 11 is formed by making part of the uneven structure 20 protrude toward the light transmissive electrode 3. Further, the multiple protruded parts 11 have almost the same heights. In this regard, for example, the phrase "the protruded parts 11 have almost same heights" means that differences between the heights of the multiple protruded parts 11 and an average of the heights of the multiple protruded parts 11 are within a range of ±10% of the average, and preferably are within a range of ±5% of the average.

In FIG. 11B, a section of the protruded part 11 has a rectangular shape, but may have an appropriate shape such as a corrugated shape, an inverted-triangle shape, a trapezoidal shape, a semicircular shape, semi-ellipse shape, and a sinusoidal shape. When two protruded parts 11 are adjacent to each other, these protruded parts 11 are connected integrally to form a larger protruded part. When two recessed parts 12 are adjacent to each other, these recessed parts 12 are connected integrally to form a larger recessed part. The connection number of protruded parts 11 and the connection number of recessed parts 12 are not limited particularly. However, as the connection numbers increase, the uneven structure 20 tends not to have fine structures. For example, the connection numbers may be appropriately set to be equal to or less than 100, 20, or 10. Note that, it is possible to introduce a design rule defining that when two or three or more regions corresponding to one of the recessed part 12 and the protruded part 11 are continuous, a region next to such continuous regions is set to correspond to the other of the recessed part 12 and the protruded part 11 (when the specific region is recessed, the next region is protruded, and when the specific region is protruded, the next region is recessed). When this rule is used, the light diffusion effect is improved, and therefore it is expected that the efficiency and the color difference can be improved.

The uneven structure 20 is formed so that with regard to an arbitrary region of the plane, a ratio of a total area of one or some of the multiple protruded parts 11 in the arbitrary region to an area of the arbitrary region is almost constant. For example, FIG. 11A shows a total number of one hundred of uneven sections arranged in a 10 by 10 matrix manner. A region constituted by these one hundred sections is used as a unit region. In the plane of the uneven structure 20, the area ratios of protruded parts 11 are same with regard to unit regions. For example, as shown in FIG. 11A, when the fifty protruded parts 11 are provided to a unit region, other about fifty (e.g., forty-five to fifty-five or forty-eight to fifty-two) protruded parts 11 may be provided to another region which is same in the number of sections to be recessed and protruded and the area as the unit region. The unit region is not limited to a region corresponding to one hundred sections, but may be a region having a size corresponding to an appropriate number of sections. For example, the number of sections may be 1000, 10000, 1000000, or more. The area ratio of protruded parts 11 slightly varies depending on how to define the region. However, in this example, the area ratios are set to be almost same. For example, a difference between each of upper and lower limits of the area ratio and an average of the area ratio is preferably equal to or less than 10% of the average, and more preferably equal to or less than 5% of the average, and more preferably equal to or less than 3% of the average, and more preferably equal to or less than 1% of the average. As the area ratio becomes more equal to each other, the light-outcoupling efficiency can be more uniformed in the plane and more improved. The area ratio of protruded parts 11 in the unit region is not limited particularly, but may be in a range of 20% to 80%, and preferably in a range of 30% to 70%, and more preferably in a range of 40% to 60%.

In a preferable embodiment, the protruded parts 11 and the recessed parts 12 are arranged in a random allocation manner in each unit region. In this embodiment, it is possible to allow a large amount of light to emerge without causing angle dependency. Therefore, it is possible to realize the structure suitable for the white organic EL element.

The uneven structure 20 preferably includes fine recesses and protrusions. Thus, the light-outcoupling efficiency can be more improved. For example, when each section to be recessed or protruded is formed as a square with a side in a range of 0.1 µm to 100 µm, it is possible to form a fine uneven structure. A side of a square defining one section to be recessed or protruded may be in a range of 0.4 µm to 10 µm. For example, when the side of the square is 1 µm, it is possible to form the fine uneven structure 20 precisely. Further, the unit region may be a region in a shape of 1 mm square or 10 mm square. Note that, in the uneven structure 20, material forming the uneven structure 20 may not be present in the recessed part 12. In this case, the lower layer (the first transparent material layer 21) of the uneven structure 20 may be a layer in which multiple fine protruded parts 11 are distributed on a whole surface in an island manner. For example, the second transparent material layer 22 may be directly in contact with the substrate 1 at the recessed part(s) 12.

The heights of the protruded parts 11 are not limited particularly, but may be in a range of 0.1 µm to 100 µm, for example. Thus, it is possible to produce the uneven structure 20 with the high light-outcoupling efficiency. For example, when the heights of the protruded parts 11 are set to be in a range of 1 to 10 µm, it is possible to form fine recesses and protrusions precisely.

The multiple protruded parts 11 constituting the uneven structure 20 may have the same shape. In FIG. 11A, the protruded part 11 is provided to cover the entire uneven section, and thus the protruded part 11 has a quadrangle (rectangular or square) shape in a plan view. The planar shape of the protruded part 11 is not limited to this example, but may be another shape such as a circular shape and a polygonal shape (e.g., a triangular shape, a pentagonal shape, a hexagonal shape, and an octagon shape). In these cases, a three-dimensional shape of the protruded part 11 may be an appropriate shape such as a cylindrical shape, a prism shape, (e.g., a triangular prism shape and a rectangular prism shape), a pyramid shape (e.g., a triangle-based pyramid, and a rectangle-based pyramid), a hemispherical shape, a semi-ellipsoidal shape, a protrusion with a sinusoidal section.

In a preferable embodiment, the uneven structure 20 is formed as a diffraction optical structure. In this regard, it is preferable that the protruded parts 11 be provided to show some degree of regularity to give a diffraction optical structure. In the diffraction optical structure, it is preferable that the protruded parts 11 be formed periodically. When the light diffusion layer 2 has the diffraction optical structure, the light-outcoupling efficiency can be improved. Further, in the implemented embodiment, when the light diffusion layer 2 has a diffraction structure, the light-outcoupling layer 7 (e.g., an optical film) formed on the opposite surface of the substrate 1 from the light diffusion layer 2 can scatter light, and therefore effects of the view angle dependency can be reduced. In the diffraction optical structure, it is preferable that an interval P of two-dimensional uneven structure 20 (average interval of the uneven structure 20 in a case where the uneven structure 20 is not a periodic structure) be appropriately set to be in a range of ¼λ to 100λ wherein λ is a wavelength in a medium (which is obtained by dividing a wavelength in vacuum by a refractive index of a medium). This range may be used in a case where a wavelength of light emitted from the light emitting layer E is in a range of 300 nm to 800 nm. In this case, a geometrical optics effect (enlargement of an area of the surface which light strikes at an angle less than the total reflection angle) causes an increase in the light-outcoupling efficiency. Or, light striking the surface at an angle not less than the total reflection angle can be emitted outside as diffraction light. Consequently, the light-outcoupling efficiency is improved. When the interval P is especially small (e.g., the range of λ/4 to λ), an effective refractive index at a portion around the uneven structure is gradually decreased with an increase in distance between the portion and the substrate. This is equivalent to interposing, between the substrate and a layer of covering protrusions and recesses or the anode, a thin layer having a refractive index between the refractive index of the medium of the uneven structure and the refractive index of the covering layer or the anode. Consequently, it is possible to suppress the Fresnel reflection. In brief, with selecting the interval P from the range of λ/4 to 100λ, it is possible to suppress the reflection (total reflection and/or Fresnel reflection), and therefore improve the light-outcoupling efficiency. In the above range, when the interval P is smaller than λ, only the effects of suppressing Fresnel loss can be expected, and therefore the light-outcoupling efficiency is likely to decrease. In contrast, when the interval P exceeds 20λ, it is required to increase heights of recesses and protrusions accordingly (to ensure a phase difference), and therefore flattening by the covering layer (the second transparent material layer 22) is likely to becomes difficult. It is considered to use the covering layer having a very large thickness (e.g., 10 μm or more). However, in this case, there are bad effects such as a decrease in transmissivity, an increase in material cost, and an increase in outgas in a case of resin material. Therefore, to thicken the covering layer may be disadvantageous. In view of this, it is preferable to set the interval P to be in a range of λ to 20λ, for example.

The uneven structure 20 may be a boundary diffraction structure. The boundary diffraction structure may be formed by arranging the protruded parts 11 randomly. Alternatively, the boundary diffraction structure may be a structure in which diffraction structures formed within very small regions of a plane are arranged in the plane. This structure may be interpreted as a structure in which multiple independent diffraction structures are arranged in plane. In the boundary diffraction structure, diffraction caused by the fine diffraction structures allows light to emerge, and however the diffraction effect of the whole surface is prevented from being excessive, and therefore the angle dependency of light can be lowered. Therefore, the angle dependency can be suppressed and nevertheless the light-outcoupling efficiency can be improved.

In case where the protruded parts 11 and the recessed parts 12 are provided randomly as shown in FIG. 11A and FIG. 11B, if the number of continuous protruded parts 11 or recessed parts 12 excessively increases, the light-outcoupling efficiency is unlikely to be improved sufficiently. In view of this, a more preferable example of the uneven structure 20 is described hereinafter.

[Random Control on Uneven Structure]

Preferably, randomness in presence of protrusions and recesses of the uneven structure 20 is controlled. In this regard, the shape of the uneven structure 20 is defined as follows. A structure in which protrusions and recesses are arranged perfectly randomly is defined as a perfect random structure. A structure in which protrusions and recesses are arranged randomly under a predetermined rule is defined as a controlled random structure. A structure in which protrusions and recesses are arranged not randomly but regularly to show predetermined periodicity is defined as a periodic structure. Further, one of the sections 10 of the array is considered to be a block, and a size of one block is defined as w. When the block is a quadrangle, the size of the block means a side of the quadrangle. When the block is a hexagon, the size of the block means a diameter of a circle inscribed in the hexagon. With regard to large protruded parts each defined by continuous protruded parts 11, when there are a first large protruded part and a second large protruded part which is next to but is spaced from the first large protruded part, a distance between the same sides of the first and second large protruded parts is defined as an average interval. In summary, the average interval is equal to an average pitch.

In control for the controlled random structure, it is preferable to set a rule defining that the number of same blocks (corresponding to one of the protruded part 11 and the recessed part 12) arranged consecutively must not be greater than a predetermined number. In other words, it is preferable that the protruded parts 11 are arranged so that the number of protruded parts 11 arranged by being individually allocated to continuous sections 10 of the array in a same direction is not greater than a predetermined number, and the recessed parts 12 are arranged so that the number of recessed parts 12 arranged by being individually allocated to continuous sections 10 of the array in a same direction is equal to or less than a predetermined number. Consequently, the light-outcoupling efficiency can be more improved. Further, the angle dependency of emission color can be reduced. The predetermined number defining the maximum number of the protruded parts 11 or the recessed parts 12 which are arranged consecutively is preferably equal to or less than 10, and is more preferably equal to or less than 8, and is more preferably equal to or less than 5, and is more preferably equal to or less than 4.

Figure 12A:
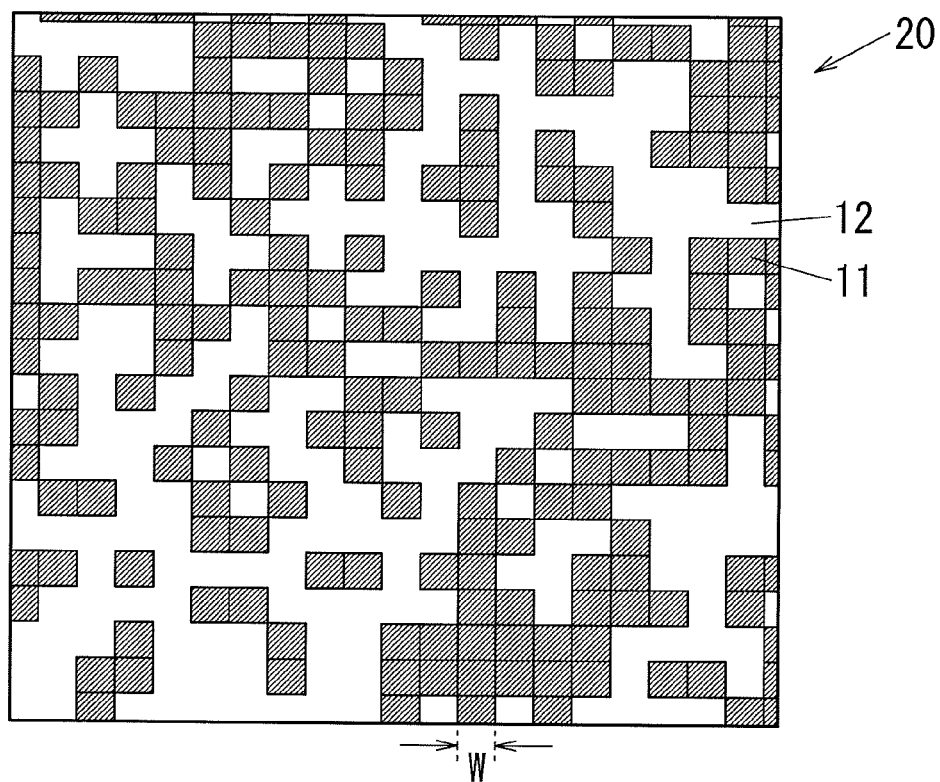
FIG. 12A is an explanatory view illustrating another example of the uneven structure and a plan thereof.
Figure 12B:
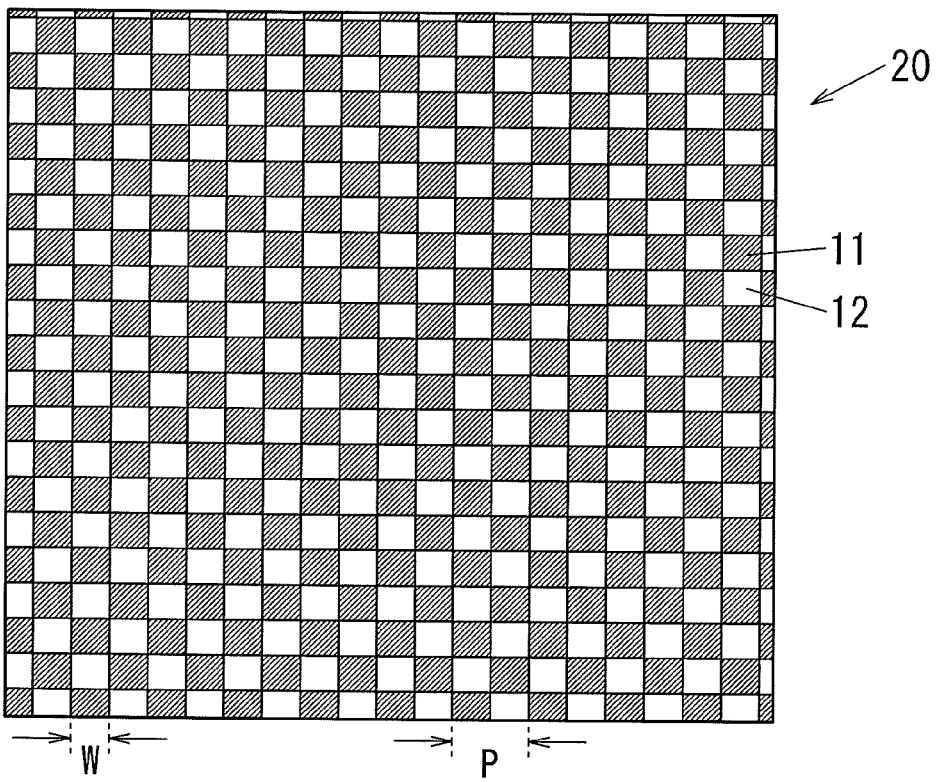
FIG. 12B is an explanatory view illustrating another example of the uneven structure and a plan thereof.

The principle of the uneven structure 20 is described with reference to FIG. 12A and FIG. 12B. FIG. 12A shows the uneven structure 20 corresponding to the perfect random structure, and FIG. 12B shows the uneven structure 20 corresponding to the periodic structure. Hatched parts denote the protruded parts 11, and white parts denote the recessed parts 12. This is also applied to the following explanatory views of the uneven structure 20.

When the blocks with a certain size w are arranged periodically with regularity as shown in FIG. 12B, the average interval is 2w. In summary, the protruded parts 11 and the recessed parts 12 are arranged alternately, and therefore the protruded parts 11 are arranged at the average interval corresponding to the sizes of two blocks. Note that, in the example of FIG. 12B, the uneven structure 20 has a checker pattern.

When the blocks with a certain size w are arranged perfectly randomly as shown in FIG. 12A, the average interval is 4w.

Figure 13A:
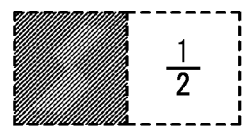
FIG. 13A is an explanatory view illustrating arrangement of blocks (sections) of the uneven structure.
Figure 13B:
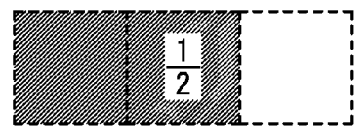
FIG. 13B is an explanatory view illustrating other arrangement of blocks (sections) of the uneven structure.
Figure 13C:
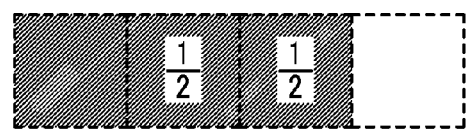
FIG. 13C is an explanatory view illustrating other arrangement of blocks (sections) of the uneven structure.

How to calculate the average interval in the perfect random structure is described with reference to FIG. 13A, FIG. 13B and FIG. 13C. In random arrangement, a probability that the same blocks are arranged consecutively is taken into account. As shown in FIG. 13A, first, a probability that the block (the protruded part 11) with a width w exists is ½. As shown in FIG. 13B, a probability that the two same blocks are arranged consecutively is (½)^2. As shown in FIG. 13C, a probability that the three same blocks are arranged consecutively is (½)^3. The "^n" denotes the n-th power. In view of a probability that the four or more same blocks are arranged consecutively, the relation defined by the following expression (13) is derived.

[FORMULA 16]

$$w_{exp} = w \cdot \left(\frac{1}{2}\right)^1 + 2w \cdot \left(\frac{1}{2}\right)^2 + 3w \cdot \left(\frac{1}{2}\right)^3 + \ldots = \sum_{n}^{\infty} nw \cdot \left(\frac{1}{2}\right)^{n-1} = 2w \quad (13)$$

In the above expression, $w_{exp}$ denotes an expected value of the width of the region in which the same blocks are arranged consecutively.

In the above method, there are two types of blocks which are the protruded part 11 and the recessed part 12. Therefore, the average interval is determined by the following expression (14).

[FORMULA 17]

$$p_{exp} = 2w_{exp} = 4w \quad (14)$$

In the above expression, $p_{exp}$ denotes an expected value of the average interval.

Therefore, when the blocks are arranged completely randomly, the average interval is equal to 4w.

Also in the case of the hexagonal grid, as with the above, it is possible to calculate that the average interval P is equal to 4w, based on probabilistic approach.

Similarly, in the structure with controlled randomness (controlled random structure), the average interval can be calculated.

Figure 14A:
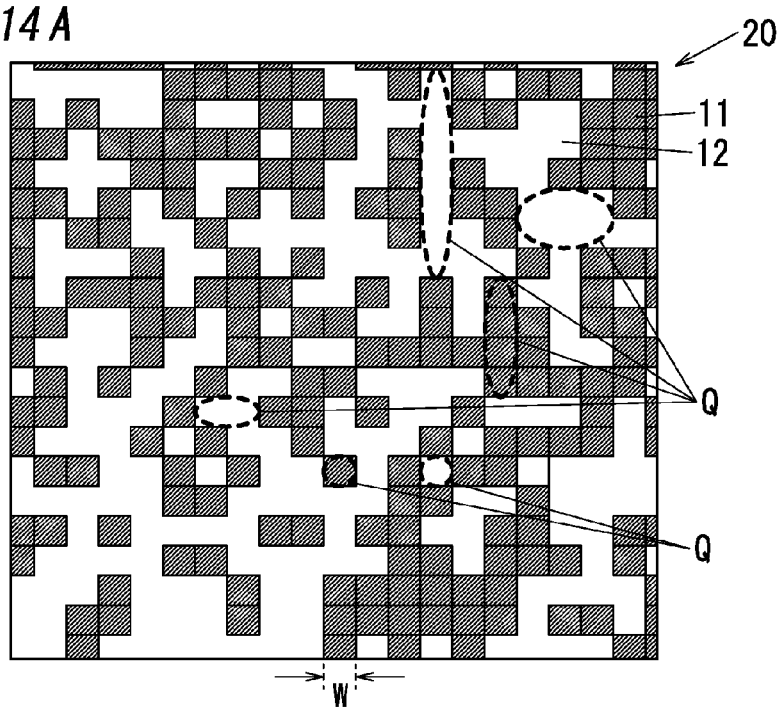
FIG. 14A is a plan illustrating one example of the uneven structure.
Figure 14B:
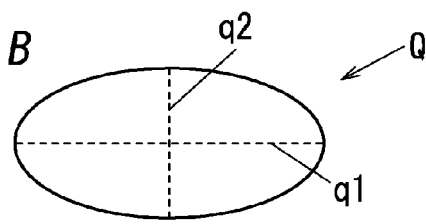
FIG. 14B is an explanatory view illustrating an ellipse used for calculating an average pitch of the uneven structure.

Another method of calculating the average interval of the complete random structure is described with reference to FIG. 14A and FIG. 14B. The width of the grid is denoted by "w". In FIG. 14A and FIG. 14B, the average interval can be calculated based on the structural pattern.

As shown in FIG. 14A, an ellipse Q can be drawn so as to be inscribed in a shape defined by a boundary of a region in which the same blocks (the protruded parts 11 or the recessed parts 12) are continuous. When the ellipse Q to be drawn is a circle, an inscribed circle is drawn. As shown in FIG. 14B, the average interval is calculated from a length q1 of a major axis and a length q2 of a minor axis of the ellipse Q. In the case of the inscribed circle, a diameter is used. In the example of FIG. 14A, the minimum value of the length q2 of the minor axis of the inscribed ellipse is equal to w, that is, the boundary width. Further, the maximum value of the length q1 of the major axis of the inscribed ellipse can be considered to be 10w. Note that, when the probability that the same blocks are arranged consecutively is ½, the same blocks may be consecutively arranged endlessly. For example, the probability that "n" protruded parts 11 are arranged consecutively is represented by (½)^n. The probability that ten protruded parts 11 are arranged consecutively is (½)^10=1/1028=0.00097. The probability of presence of the arrangement in which ten protruded parts 11 are arranged consecutively is equal to or less than 0.1%. This probability is extremely low and can be ignored. Therefore, as with the above, the maximum value of the length q1 of the major axis of the inscribed ellipse Q may be considered to 10w. Based on structural calculation, the average of the lengths of the axes of the inscribed ellipse is determined to 2w. This 2w means the average boundary width. Therefore the average pitch is 4w.

Figure 15:
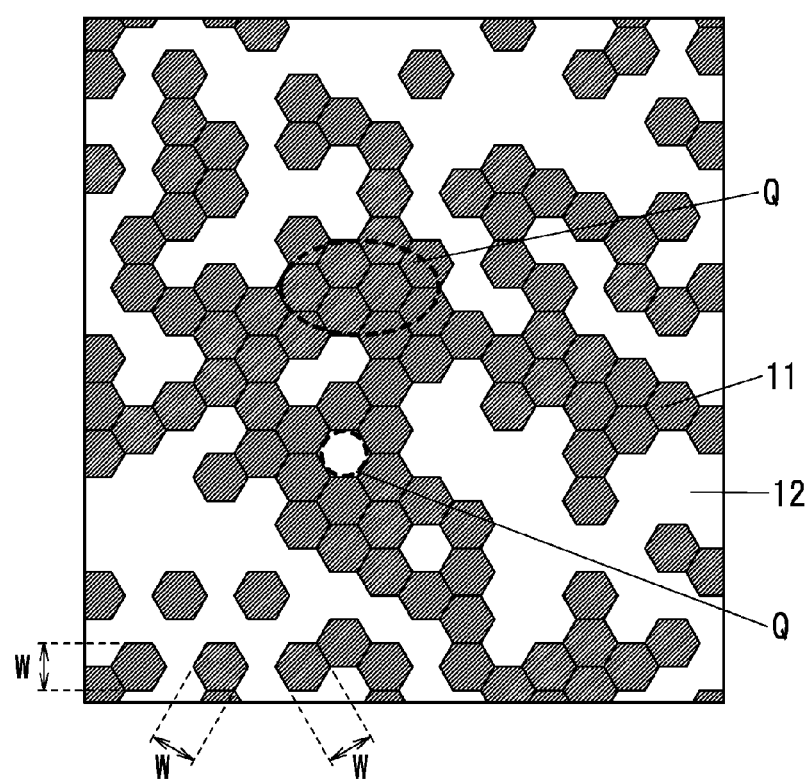
FIG. 15 is a plan illustrating another example of the uneven structure.

FIG. 15 shows an example of the uneven structure 20 with a complete random structure (boundary diffraction structure) of a hexagonal grid. The width of the grid is denoted by "w". The average interval can be calculated based on lengths of axes of an inscribed ellipse Q as with the quadrangular grid. Thus, the minimum value of the length q2 of the minor axis of the inscribed ellipse is w, and is equal to the boundary width. Further, the maximum value of the length q1 of the major axis of the inscribed ellipse may be considered to 10w. The average of the lengths of the axes of the inscribed ellipse Q is determined to 2w. This 2w means the average boundary width. Therefore the average pitch is 4w.

Figure 16A:
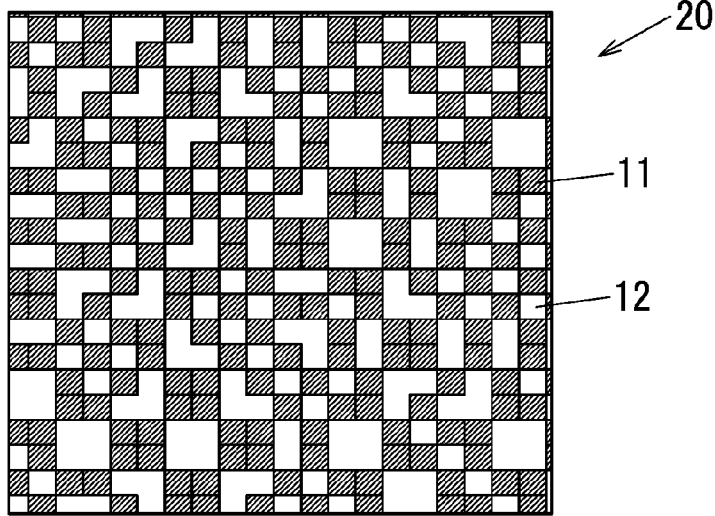
FIG. 16A is a plan illustrating another example of the uneven structure.
Figure 16B:
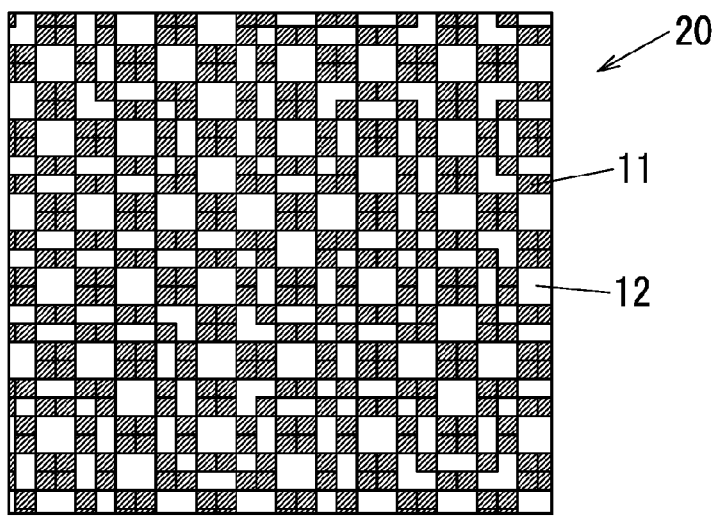
FIG. 16B is a plan illustrating another example of the uneven structure.
Figure 16C:
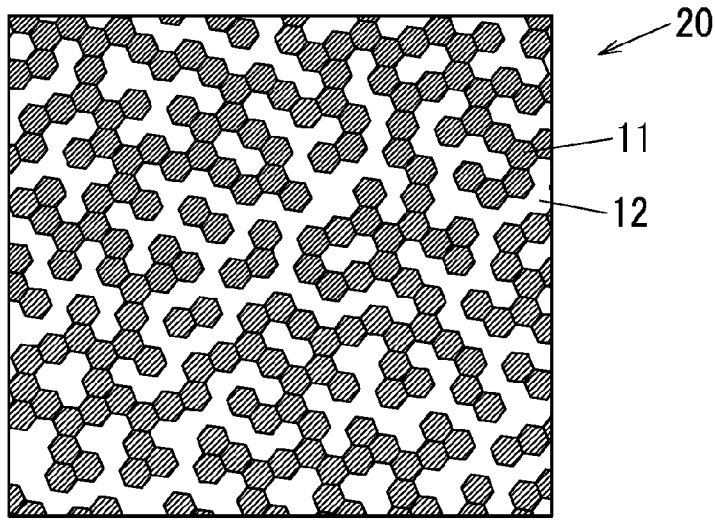
FIG. 16C is a plan illustrating another example of the uneven structure.

FIG. 16A, FIG. 16B and FIG. 16C show examples of the uneven structure 20 with the controlled random structure. FIG. 16A shows the quadrangular grid structure with the average pitch of 3w. FIG. 16B shows the quadrangular grid structure with the average pitch of 3.3w. FIG. 16C shows the hexagonal grid structure with the average pitch of 3.4w.

Figure 17A:
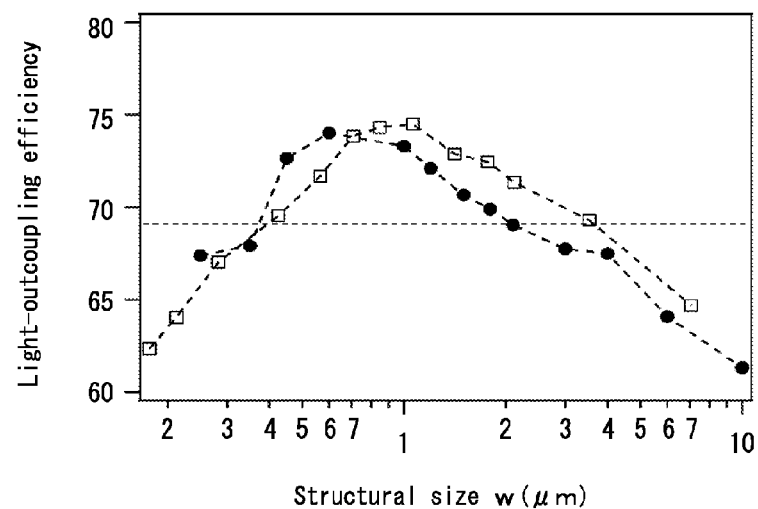
FIG. 17A is a graph illustrating a relation between the structural size and the light-outcoupling efficiency of the uneven structure.
Figure 17B:
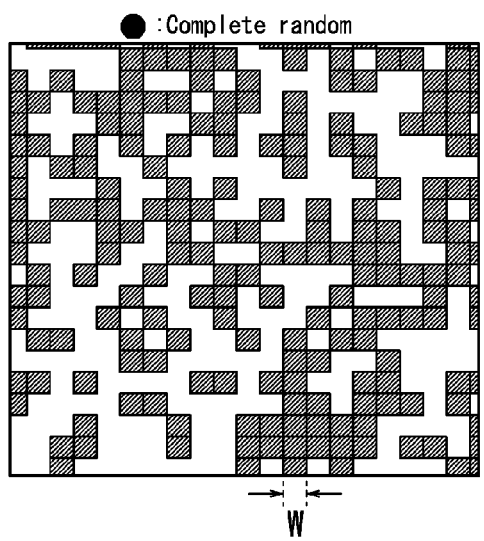
FIG. 17B is a plan illustrating another example of the uneven structure.
Figure 17C:
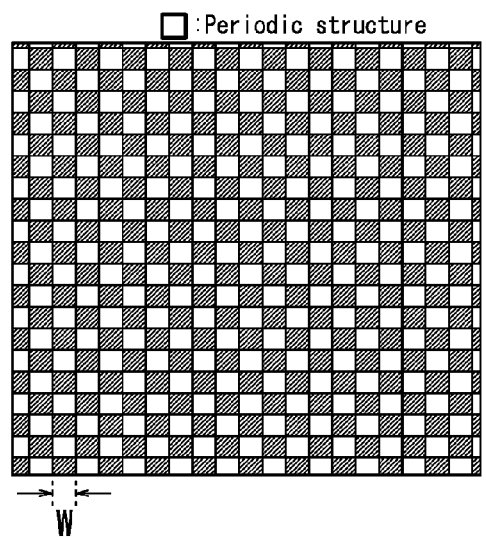
FIG. 17C is a plan illustrating another example of the uneven structure.

FIG. 17A is a graph illustrating a variation of the light-outcoupling efficiency with a change in the structural size w (the length of one section) of the uneven structure 20. This graph shows that the light-outcoupling efficiency depends on the structural size w of the uneven structure 20. In this example, level differences between protrusions and recesses are 1.0 µm. The refractive index of the substrate 1 is 1.5. The refractive index of the first transparent material layer 21 is 1.35. The refractive index of the second transparent material layer 22 is 2.0. The wavelength (the weighted average emission wavelength λ) of light is 550 nm. The graph shows the result (●) of the uneven shape of the complete random structure shown in FIG. 17B, and the result (□) of the uneven shape of the periodic structure shown in FIG. 17C. It is understood from this graph that the structural size w is preferably in a range of 0.4 µm to 2 µm in the case of the complete random structure. Further, it is understood that the structural size w is preferably in a range of 0.4 µm to 4 µm in the case of the periodic structure.

Light is not diffracted by a structure with a size sufficiently smaller than the wavelength of the light. Hence, in each of the random structure and the periodic structure, it is difficult to obtain the desired effect when the structural units of sizes of not more than 400 nm (not more than 0.4 µm) are arranged. In view of this, when the weighted average wavelength of the light emitting layer E is represented by λ, it is understood that the size w of the block is preferably equal to or more than 0.73 (=400/550) λ.

With regard to a region in which the structural unit is sufficiently greater than the wavelength, favorable results are obtained when "w" is equal to or less than 2 µm in the case of the random structure, or when "w" is equal to or less than 4 µm in the case of the periodic structure. Based on this fact and that the average interval of the complete random structure is 4w and the average interval of the periodic structure is 2w, it is preferable that the average pitch P be equal to or less than 8 µm. Further, based on the principle of diffraction of light, the diffraction pattern of light is determined by the ratio of the structural size (interval) to the wavelength, which means P/λ. Therefore, it is understood that the average pitch P is preferably equal to or less than 14.5 (=8/0.55) λ. Note that, this result shows that the approximate light-outcoupling efficiency is mainly determined by the average pitch irrespective of the structural pattern.

From the above fact, it is understood that, with regard to any part of the aggregate of protruded parts 11 or recessed parts 12, an axial length of an inscribed ellipse Q or a diameter of an inscribed circle when viewed in a direction perpendicular to a surface of the substrate be preferably in a range of 0.4 µm to 4 µm. Note that, part of the aggregate of protruded parts 11 or recessed parts 12 corresponding to the upper limit of the range may be constituted by protruded parts or the recessed parts provided to consecutive multiple sections. As described above, the ellipse Q is drawn imaginarily. When in drawing the ellipse Q, the major axis is equal to the minor axis, the ellipse Q is a circle, that is, a true circle. Hence, in the above range, the ellipse Q is used when the ellipse Q can be drawn, and a circle is used when a circle is obtained as a result of drawing the ellipse Q. The upper limit of the axial length means an upper limit of the major axis, and the lower limit of the axial length means a lower limit of the minor axis.

The difference in the light-outcoupling efficiency between the case where the protruded parts or the recessed parts are arranged randomly and the case where the protruded parts or the recessed parts are arranged periodically is not so great. However, the periodic structure has a diffraction grating property, and therefore may cause an increase in the wavelength dependency and an increase in the color unevenness in view angles. Hence, the uneven shape is preferably a shape in which structures are arranged randomly. Further, it is understood that a length of one section of the array of sections 10 is preferably in a range of 0.4 µm to 4 µm.

Figure 18A:
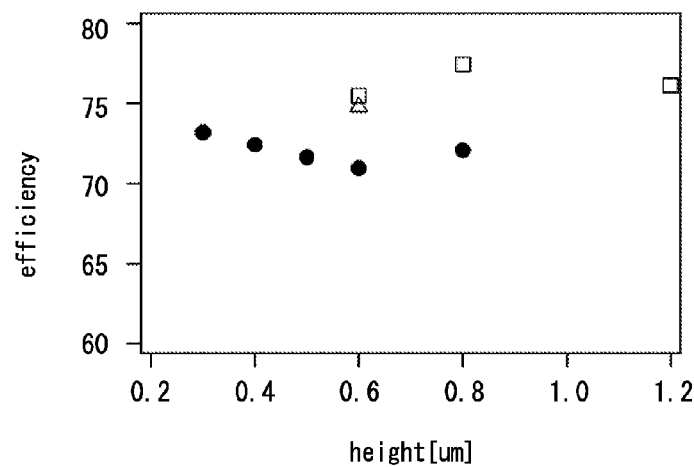
FIG. 18A is a graph illustrating a relation between the level difference between protrusions and recesses and the light-outcoupling efficiency of the uneven structure.

FIG. 18A shows a graph illustrating change in the light-outcoupling efficiency versus change in the level difference between protrusions and recesses of the uneven structure 20.

Figure 18B:
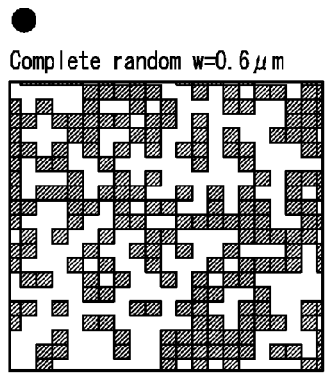
FIG. 18B is a plan illustrating another example of the uneven structure.
Figure 18C:
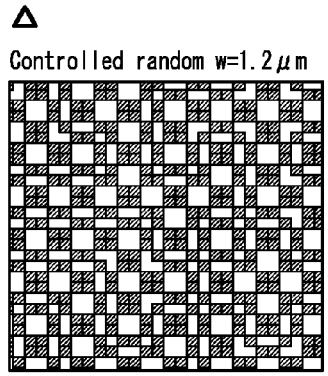
FIG. 18C is a plan illustrating another example of the uneven structure.

This graph shows a dependency of the light-outcoupling efficiency on the level difference between protrusions and recesses of the uneven structure 20. In this example, the substrate 1 has the refractive index of 1.51. The first transparent material layer 21 has the refractive index of 1.45. The second transparent material layer 22 has the refractive index of 1.76. The wavelength (the weighted average emission wavelength λ) of light is 550 nm. The evaluation were made based on the uneven structures 20 shown in FIG. 18B, FIG. 18C and FIG. 18D. The structural size w of FIG. 18B is 0.6 μm. The structural size w of FIG. 18C is 1.2 μm. The structural size w of FIG. 18D is 1.2 μm.

Figure 18D:
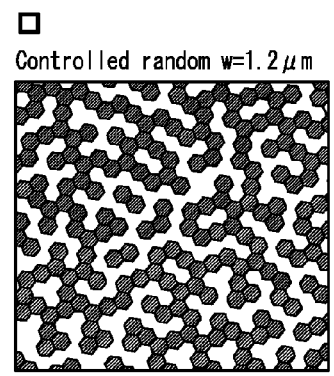
FIG. 18D is a plan illustrating another example of the uneven structure.

The graph of FIG. 18A shows the result (●) of the complete random structure shown in FIG. 18B, the result (Δ) of the controlled random structure shown in FIG. 18C, and the result (□) of the controlled random structure shown in FIG. 18D. In the controlled random structure of FIG. 18C, three or more same blocks are not arranged in the same direction. In FIG. 18C, the average pitch is 3w. In the controlled random structure of FIG. 18D, four or more same blocks are not arranged in the same direction. In FIG. 18D, the average pitch is 3.4w. It is understood from this graph that the light-outcoupling efficiency is hardly affected by the level difference between protrusions and recesses in any of the structures. Consequently, it is considered that the dependency on the level difference between protrusions and recesses is weak.

In contrast, the graph shows that, in consideration of randomness of protrusions and recesses, the light-outcoupling efficiency tends to improve in the ascending order of (●), (Δ), and (□). With regard to this result, as understood from comparison of (●) and (Δ), it is preferable the randomness is controlled and blocks are not arranged consecutively. It is considered that this is because when blocks are arranged consecutively, regions with large structural sizes are substantially present, and the light-outcoupling efficiency is decreased in such regions. Actually, the complete random structure of FIG. 18B shows a region in which six or more blocks are arranged in the same direction. For example, when the structural size is 0.6 μm, a structure with a size of 3.6 μm (=0.6 μm×6) may be present locally. In FIG. 17A, the result of the periodic structure shows that the light-outcoupling efficiency is not so high when the size of the uneven section is 3.6 μm. Therefore, it is considered that local presence of regions with large sizes may lead to a decrease in the light-outcoupling efficiency. Consequently, it is preferable that the protruded parts 11 be arranged so that the number of protruded parts arranged by being individually allocated to consecutive sections of the array in a same direction is not greater than a predetermined number. Similarly, it is preferable that the recessed parts 12 be arranged so that the number of recessed parts arranged by being individually allocated to consecutive sections of the array in a same direction is not greater than a predetermined number.

Further, it is preferable that the blocks (the array of sections 10) have hexagonal shapes rather than quadrangular shapes. It is considered that this is because the regular hexagonal shape is smaller in dependency on orientation directions than the square shape. This is because, in the quadrangular shape, the length of the diagonal is equal to the length of the side multiplied by √2 (square root of 2=about 1.414), and, in the hexagonal shape, the length of the diagonal is equal to the length of the side multiplied by √3/2 (half of the square root of 3=about 0.8660). This means that, when the squares are arranged, the light-outcoupling efficiency may be decreased in either the direction of sides or the direction of diagonals, and, in contrast, when the regular hexagons are arranged, the higher light-outcoupling efficiency can be obtained irrespective of orientations. It is considered that this may be because the honeycomb structure is a close packed structure.

Figure 19:
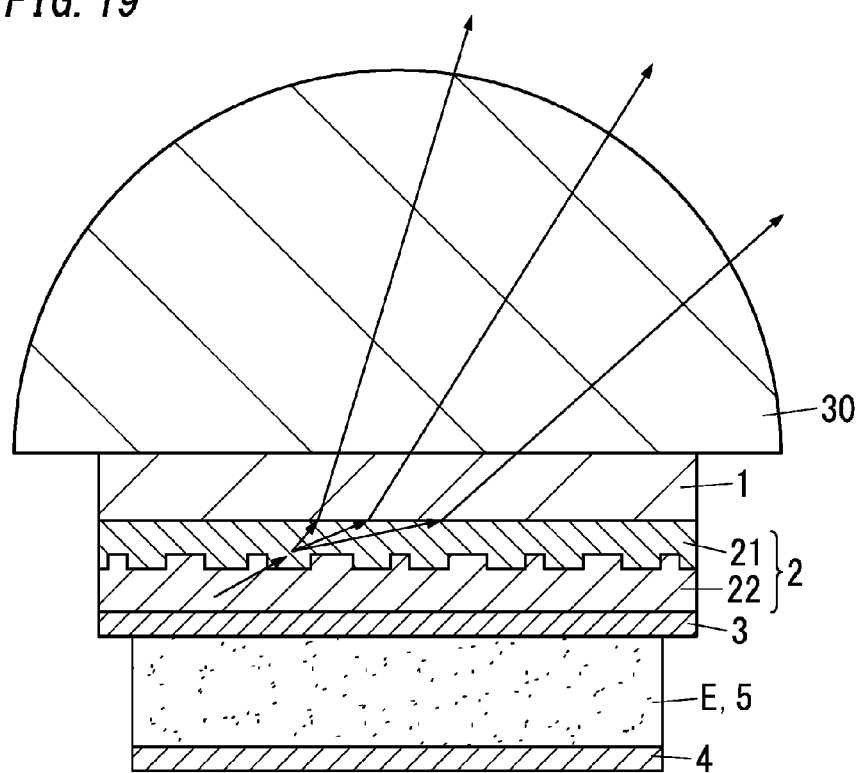
FIG. 19 is a section illustrating an example of a method of measuring light intensity of the organic EL element.

To examine in detail the effects of pattern in which the randomness is controlled, the distribution of intensity of light inside the substrate 1 was measured with regard to each of the complete random structure and the controlled random structure (the level difference between protrusions and recesses is 0.6 μm) described in FIG. 18B and FIG. 18C. FIG. 19 shows a measuring device. This measuring device has a hemispherical lens 30 to measure the intensity of light. The components same as those of the aforementioned structure are designated by the same reference signs, in order to omit the redundant explanations.

Figure 20A:
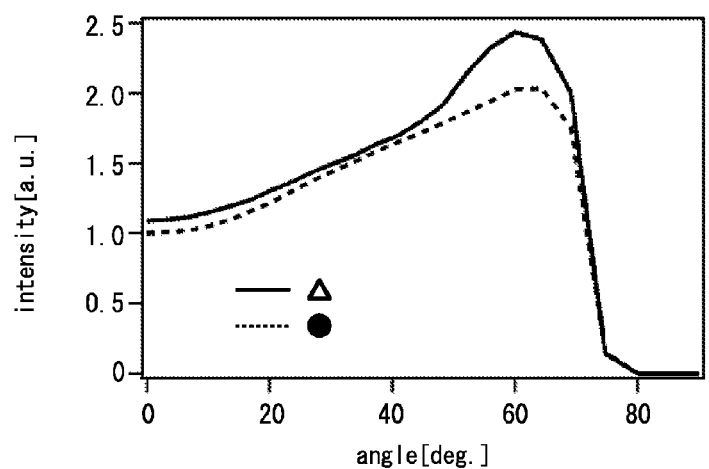
FIG. 20A is a graph illustrating change in the light intensity versus change in the uneven structure.
Figure 20B:
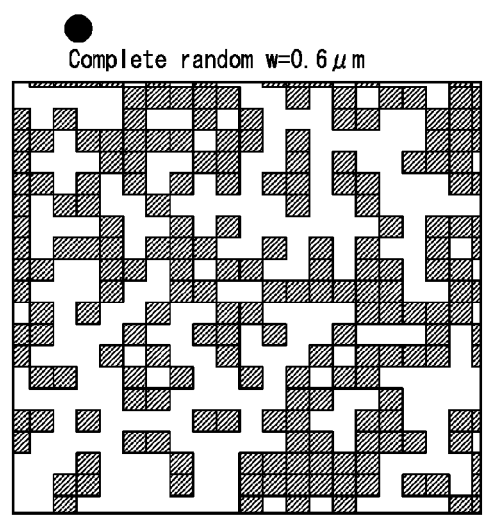
FIG. 20B is a plan illustrating another example of the uneven structure.
Figure 20C:
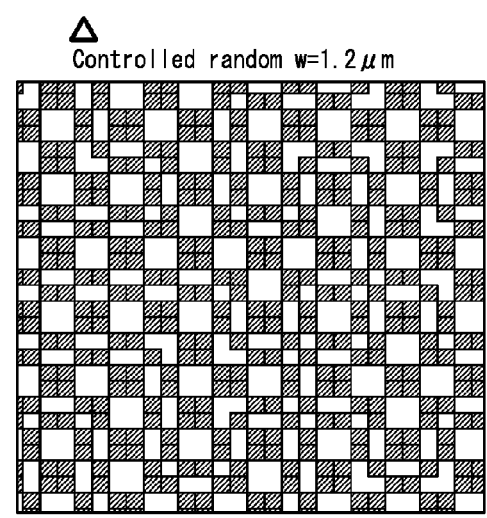
FIG. 20C is a plan illustrating another example of the uneven structure.

FIG. 20A is a graph illustrating relations between the angle and the light intensity with regard to different randomness. This graph shows a result (indicated by a broken line) of the complete random structure shown in FIG. 20B and a result (indicated by a solid line) of the controlled random structure shown in FIG. 20C. This graph shows that intensity of light at a high angle region (angles from about 50 degrees to 70 degrees) is increased in the structure in which randomness is controlled (i.e., the controlled random structure) than in the complete random case.

The method of controlling randomness by suppressing occurrence of the large region constituted by consecutive arranged blocks and the effect thereof are described as above. The effects by suppressing occurrence of such a large region can also be confirmed by use of Fourier transform of random pattern.

Figure 21A:
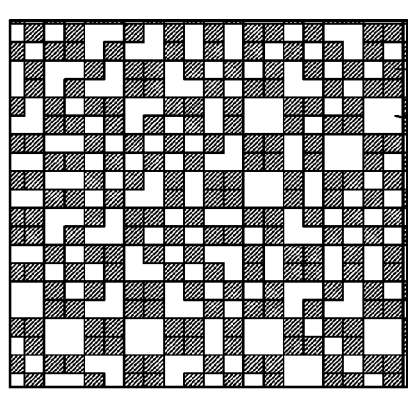
FIG. 21A is a plan illustrating another example of the uneven structure.
Figure 21B:
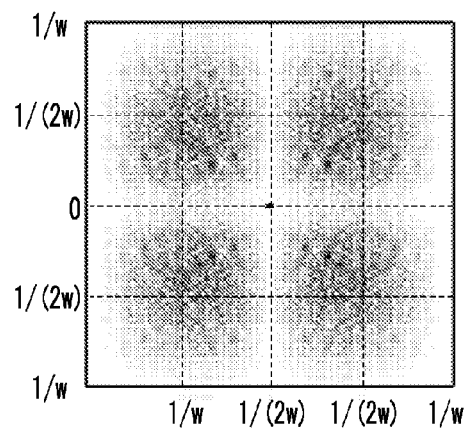
FIG. 21B is a result of Fourier transform based on the uneven structure.
Figure 21C:
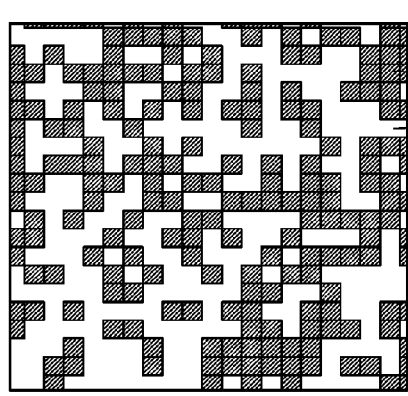
FIG. 21C is a plan illustrating another example of the uneven structure.
Figure 21D:
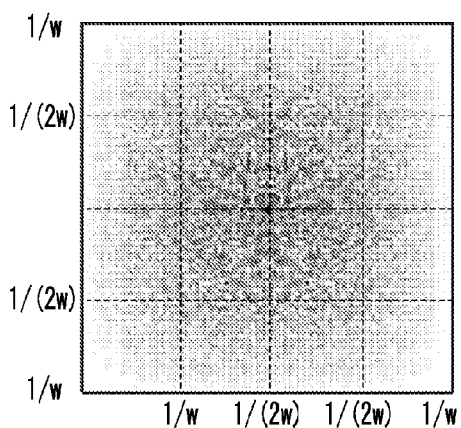
FIG. 21D is a result of Fourier transform based on the uneven structure.

FIG. 21A to FIG. 21D include views illustrating amplitudes of spatial frequency components obtained by Fourier transform of random pattern. FIG. 21A shows the random pattern of the controlled random structure, and FIG. 21B shows the result of the Fourier transform of the random pattern shown in FIG. 21A. FIG. 21C shows the random pattern of the complete random structure, and FIG. 21D shows the result of the Fourier transform of the random pattern shown in FIG. 21C.

In each of FIG. 21B and FIG. 21D, the center of the view indicates a component (DC component) corresponding to the spatial frequency of 0, and the spatial frequency becomes greater towards the periphery of the view than at the center of the view. As understood from the views, it is confirmed that the low frequency components are suppressed in the spatial frequency of the controlled random pattern. Especially, it is understood that components, which are lower than $1/(2w)$, of the spatial frequency components are suppressed. When the randomness is controlled as described above, the low frequency components are removed. In view of this, the controlled random structure may be referred to as low frequency removing structure.

Even when the randomness is controlled, the average pitch can be calculated. Note that, the boundary width (structural size) w is preferably equal to or more than 0.73λ. The value of 0.73 is obtained by dividing 400 by 550. The upper limit of the average pitch is preferably 8 μm.

Further, it is preferable that the structural size w (a length of each section of the array) be in a range of 0.4 μm to 4 μm. Moreover, the structural size w is preferably in a range of 0.4 μm to 2 μm.

Note that, in the aforementioned uneven structure 20, the level differences between protrusions and recesses are same. However, the level differences between protrusions and recesses may be random. The uneven structure 20 is constituted by stacked layers of two transparent materials, and therefore phase differences may occur when light propagates these parts. Even when the level differences are random, the average phase differences of rays of transmitted light may be determined by average level differences. Hence, also in this case, sufficient average phase differences are given to rays of transmitted light, and the rays are made to emerge, and therefore the level differences may be random.

Further, in the uneven structure 20, each corner of each section may be rounded. For example, in processing micro-order structures by cutting and stacking, corners may be processed to be rounded, or stepped parts may be processed to have inclined surfaces. When the light diffusion layer 2 is provided by use of optical sheets or the like, these structures may be formed in processing. Even when corners of protrusions and recessed are rounded or have inclined surfaces, the light-outcoupling efficiency and the view angle dependence property can be improved, provided that the property of the random pattern is not lost.

Figure 22:
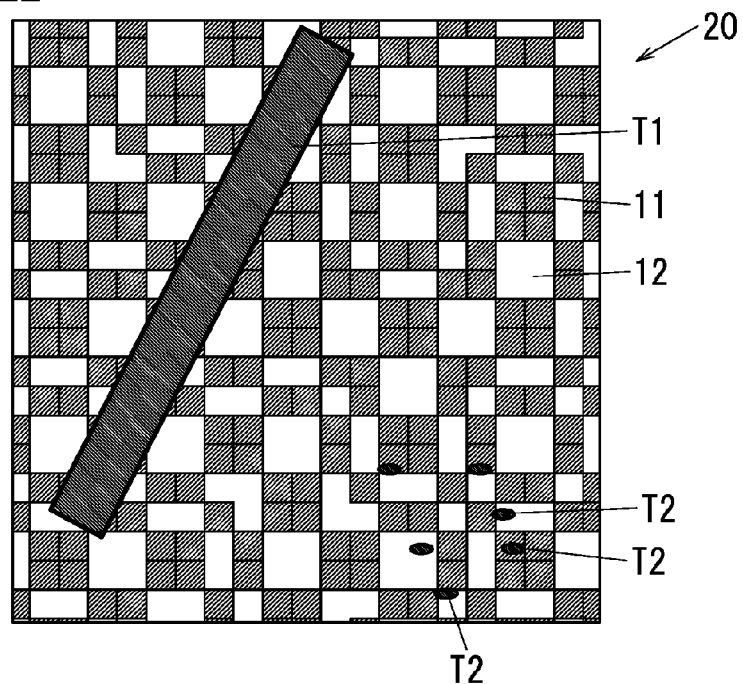
FIG. 22 is a plan illustrating an example of the uneven structure.

In some cases, the uneven structure unfortunately contains noises occurring unexpectedly in producing the organic EL element, such as small structures (e.g., structures caused by dusts or the like) with sizes of equal to or less than 0.73λ and large structures (e.g., scratches) with sizes of equal to or more than 4 μm. Also in these cases, the desired effects can be obtained sufficiently provided that the total areas of such noises are equal to or less than 10% of the whole area. FIG. 22 shows a large noise structure T1 and small noise structures T2. Even when these noises are intentionally formed to occupy 10% of the whole area, the desired organic EL element can be formed provided that the desired effects are obtained. In view of this, even when the aforementioned uneven structure 20 may be partially broken at the percentage equal to or less than 10%, this uneven structure 20 is available.

Note that, the light diffusion layer 2 may have a microlens array structure. The microlens array structure is one type of the uneven structure 20. Even when the uneven structure 20 has a microlens array structure, the light-outcoupling efficiency and the view angle property can be improved. In the microlens array structure, shapes of lenses may be appropriate shapes such as almost hemispherical shapes, semi-ellipsoidal shapes, protruded shapes with sinusoidal sections, and pyramid shapes (e.g., quadrangule-based pyramids).

[Lighting Device]

Figure 23:
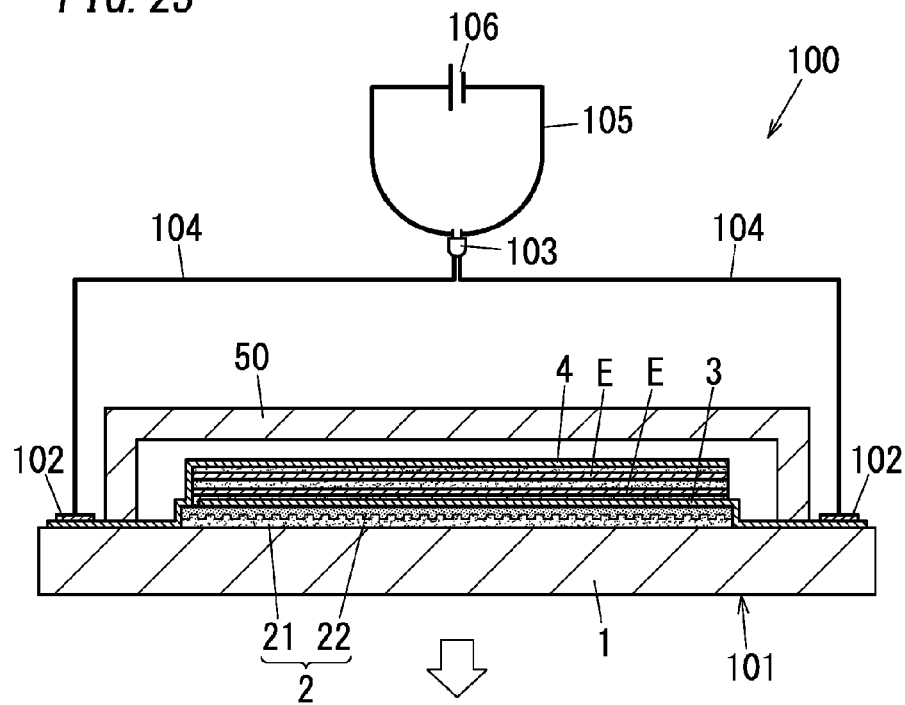
FIG. 23 is a schematic section illustrating an example of the lighting device.

FIG. 23 shows an example of a lighting device 100 including the organic electroluminescence element (the organic EL element 101). The organic EL element 101 includes the substrate 1, the light diffusion layer 2, the light transmissive electrode 3, the multiple light emitting layers E, the light reflective electrode 4, and an enclosing member 50. The light diffusion layer 2 includes the first transparent material layer 21 and the second transparent material layer 22. The organic light emitter including the light emitting layers E is enclosed by the enclosing member 50. The emitting direction of light is denoted by an outlined arrow. The lighting device 100 includes the organic EL element 101 and electrode pads 102 formed outside the enclosure of the organic EL element 101. The electrode pads 102 and the electrodes of the organic EL element 101 are electrically interconnected via appropriate wiring structures. The electrode pads 102 are connected to wires 104. The lighting device includes a plug 103 collecting the wires 104. The plug 103 is connectable to an external power source 106 via an external cable 105. When connection with the external power source 106 is made, a current flows between the electrodes, and thereby light is produced by the light emitting layers E. As a result, light can be emitted from the lighting device 100.

REFERENCE SIGNS LIST

E Light emitting layer
E1 First light emitting layer
E2 Second light emitting layer
Em m-th light emitting layer
1 Substrate
2 Light diffusion layer
3 Light transmissive electrode
4 Light reflective electrode
5 Charge transport layer
6 Interlayer
7 Light-outcoupling layer
8 Carrier transport layer
8a Non-doped layer
9 Charge inversion layer
9a Hole extraction layer
9b Blocking layer
10 Section of the array
11 Protruded part
12 Recessed part
20 Uneven structure

The invention claimed is:

1. An organic electroluminescence element, comprising:
a substrate having a light transmissive property;
a light diffusion layer on a surface of the substrate;
a light transmissive electrode on a surface of the light diffusion layer;
a light reflective electrode paired with the light transmissive electrode; and
multiple light emitting layers which are spaced from each other and are between the light transmissive electrode and the light reflective electrode,
the multiple light emitting layers including an m-th light emitting layer which is an m-th closest light emitting layer to the light reflective electrode, where m is an integer equal to or more than 1;
$\lambda_m$ representing a weighted average emission wavelength of the m-th light emitting layer;
$\emptyset(\lambda_m)$ $\emptyset_m$ representing a phase shift of light produced by the m-th light emitting layer caused by the light reflective electrode which is defined by a following expression (1):

[FORMULA 1]

$$\phi(\lambda_m) = \tan^{-1}\left\{\frac{2(n_s k_r - n_r k_s)}{n_s^2 - n_r^2 + k_s^2 - k_r^2}\right\} \quad (1)$$

wherein $n_s$ and $k_s$ represent a refractive index and an extinction coefficient of a layer in contact with the light reflective electrode, respectively, and $n_r$ and $k_r$ represent a refractive index and an extinction coefficient of the light reflective electrode, respectively, and $n_s$, $n_r$, $k_s$, and $k_r$ are functions of $\lambda_m$;
an average refractive index of a medium filling a space between the light reflective electrode and the m-th light emitting layer being represented by $n_m(\lambda_m)$;
a distance from the light reflective electrode to the m-th light emitting layer being represented by $d_m$; and each of at least two of the multiple light emitting layers satisfying relations defined by following expressions (2) and (3):

[FORMULA 2]

$$\phi(\lambda_m) \times \frac{\lambda_m}{4\pi} + \frac{l-0.1}{2}\lambda_m \leq n_m(\lambda_m) \times d_m \leq \phi(\lambda_m) \times \frac{\lambda_m}{4\pi} + \frac{l+0.6}{2}\lambda_m \quad (2)$$

where l is an integer equal to or more than 0,

[FORMULA 3]

$$n_m(\lambda_m) \times d_m \geq 0.6\lambda_m \quad (3)$$

wherein the light diffusion layer includes a first transparent material layer and a second transparent material layer arranged in this order from the substrate, an uneven structure is provided to an interface between the first transparent material layer and the second transparent material layer, and an interval P of the uneven structure is in a range of λm to 20λm.

2. The organic electroluminescence element according to claim 1, further comprising a carrier transport layer which is between the light reflective electrode and a first light emitting layer and is of a charge transport medium doped with donor material.

3. The organic electroluminescence element according to claim 1, wherein:
the light reflective electrode serves as a cathode;
the light transmissive electrode serves as an anode; and
the organic electroluminescence element further comprises a charge inversion layer and a hole transport layer which are arranged between the light reflective electrode and a first light emitting layer in this order from the first light emitting layer.

4. The organic electroluminescence element according to claim 1, wherein
the uneven structure is defined by an aggregate of protruded parts or recessed parts arranged in plane.

5. The organic electroluminescence element according to claim 4, wherein
with regard to any part of the aggregate of protruded parts or recessed parts, an axial length of an inscribed ellipse or a diameter of an inscribed circle when viewed in a direction perpendicular to a surface of the substrate is in a range of 0.4 μm to 4 μm.

6. The organic electroluminescence element according to claim 4, wherein
the aggregate of protruded parts or recessed parts has a plane divided into an array of sections, and the protruded parts or recessed parts are arranged by being individually allocated to sections randomly selected from the array.

7. The organic electroluminescence element according to claim 6, wherein:
the protruded parts are arranged so that a number of protruded parts arranged by being individually allocated to consecutive sections of the array in a same direction is not greater than a predetermined number; and
the recessed parts are arranged so that a number of recessed parts arranged by being individually allocated to consecutive sections of the array in a same direction is not greater than a predetermined number.

8. The organic electroluminescence element according to claim 1, further comprising a light-outcoupling layer on an opposite surface of the substrate from the light diffusion layer.

9. A lighting device comprising the organic electroluminescence element according to claim 1.

* * * * *